(12) United States Patent
Yamazaki

(10) Patent No.: US 6,653,687 B1
(45) Date of Patent: *Nov. 25, 2003

(54) INSULATED GATE SEMICONDUCTOR DEVICE

(75) Inventor: Shunpei Yamazaki, Tokyo (JP)

(73) Assignee: Semiconductor Energy Laboratory Co., Ltd., Atsugi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/907,578

(22) Filed: Aug. 8, 1997

(30) Foreign Application Priority Data

Aug. 13, 1996 (JP) .............................. 8-232553

(51) Int. Cl.$^7$ ............................... H01L 29/76
(52) U.S. Cl. ................. 257/345; 257/404; 257/327
(58) Field of Search ................ 257/345, 390, 257/391, 327, 368, 402–404

(56) References Cited

U.S. PATENT DOCUMENTS

| | | | |
|---|---|---|---|
| 4,454,524 A | 6/1984 | Spence | |
| 4,549,336 A | * 10/1985 | Sheppard | .................... 257/402 |
| 4,697,198 A | 9/1987 | Komori et al. | |
| 4,959,697 A | 9/1990 | Shier et al. | |
| 4,999,682 A | 3/1991 | Xu et al. | |
| 5,196,367 A | 3/1993 | Lu et al. | |
| 5,198,879 A | 3/1993 | Ohshima | |
| 5,210,437 A | 5/1993 | Sawada et al. | |
| 5,324,960 A | * 6/1994 | Pfiester et al. | .............. 257/368 |
| 5,343,051 A | 8/1994 | Yamaguchi et al. | |
| 5,350,940 A | 9/1994 | Rona | |
| 5,426,325 A | 6/1995 | Chang et al. | |
| 5,428,234 A | 6/1995 | Sumi | |
| 5,449,937 A | 9/1995 | Arimura et al. | |
| 5,532,175 A | 7/1996 | Racanelli et al. | |
| 5,548,143 A | 8/1996 | Lee | |
| 5,606,191 A | 2/1997 | Wang | |
| 5,608,231 A | 3/1997 | Ugajin et al. | |
| 5,614,752 A | 3/1997 | Takenaka | |
| 5,619,053 A | 4/1997 | Iwamatsu et al. | |
| 5,635,749 A | 6/1997 | Hong | |

FOREIGN PATENT DOCUMENTS

| | | |
|---|---|---|
| GB | 2 316 227 | 11/2001 |
| JP | 61-256769 | 11/1986 |
| JP | 02-031464 | 2/1990 |
| JP | 02-159070 | 6/1990 |
| JP | 02-196468 | 8/1990 |
| JP | 02-203566 | 8/1990 |
| JP | 04-206971 | 7/1992 |
| JP | 04-286339 | 10/1992 |
| JP | 05-283687 | 10/1993 |
| JP | 06-244103 | 9/1994 |
| JP | 07-135318 | 5/1995 |
| JP | 07-321339 | 12/1995 |
| WO | WO 88/03328 A1 | 5/1988 |

OTHER PUBLICATIONS

K.N. Kwok, "Complete Guide to Semiconductor Devices", pp. 164–165, Published by McGraw–Hill, Inc. 1995.

*Primary Examiner*—Ori Nadav
(74) *Attorney, Agent, or Firm*—Fish & Richardson P.C.

(57) ABSTRACT

Dot-pattern-like impurity regions 104 are artificially and locally formed on a channel forming region 103. The impurity regions 104 restrain the expansion of a drain side depletion layer toward the channel forming region 103 to prevent the short channel effect. The impurity regions 104 allow a channel width W to be substantially fined, and the resultant narrow channel effect releases the lowering of a threshold value voltage which is caused by the short channel effect.

18 Claims, 20 Drawing Sheets

U.S. PATENT DOCUMENTS

| | | |
|---|---|---|
| 5,661,059 A | 8/1997 | Liu et al. |
| 5,670,389 A | 9/1997 | Huang et al. |
| 5,674,788 A | 10/1997 | Wristers et al. |
| 5,675,164 A | 10/1997 | Brunner et al. |
| 5,698,884 A | 12/1997 | Dennen |
| 5,731,612 A * | 3/1998 | Buxo et al. .................. 257/345 |
| 5,786,618 A * | 7/1998 | Wen ........................... 257/404 |
| 5,801,416 A | 9/1998 | Choi et al. |
| 5,831,294 A | 11/1998 | Ugajin |
| 5,885,872 A | 3/1999 | Tamaki et al. |
| 5,893,740 A | 4/1999 | Chang et al. |
| 5,894,137 A | 4/1999 | Yamazaki et al. |
| 5,894,151 A | 4/1999 | Yamazaki et al. |
| 5,905,291 A * | 5/1999 | Utsunomiya et al. ....... 257/392 |
| 5,952,699 A | 9/1999 | Yamazaki et al. |
| 6,107,654 A | 8/2000 | Yamazaki |
| 6,111,296 A | 8/2000 | Yamazaki et al. |
| 6,118,148 A | 9/2000 | Yamazaki |

* cited by examiner

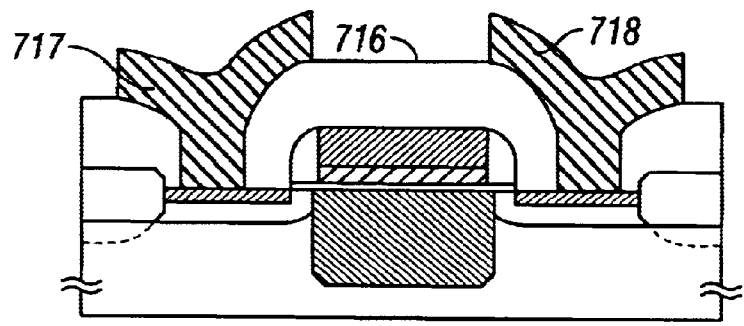
FIG. 7E
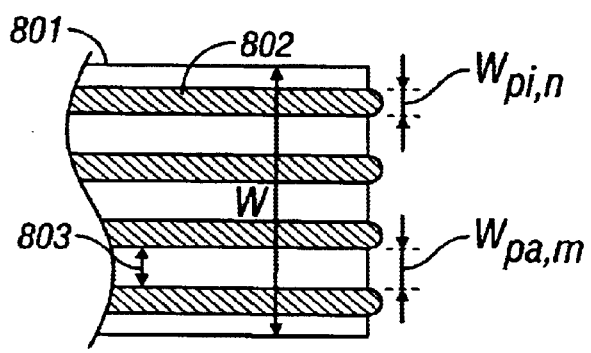
FIG. 8A
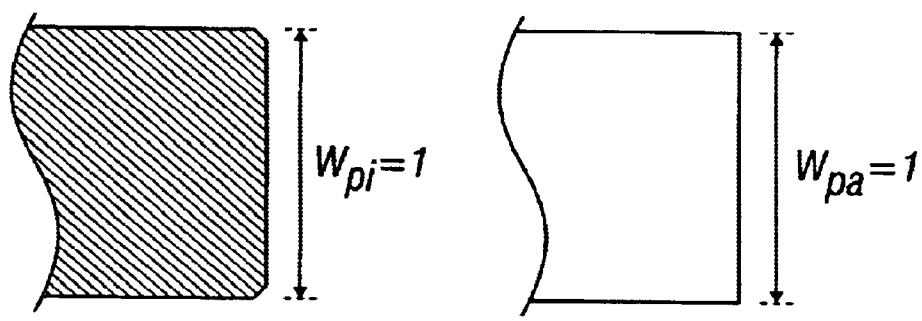
FIG. 8B  FIG. 8C

1108

1110 (SiO$_x$)

1109

US 6,653,687 B1

INSULATED GATE SEMICONDUCTOR DEVICE

BACKGROUND OF THE INVENTION

1. Field of the Invention

The present invention relates to the structure of an insulated gate semiconductor device formed using a crystalline by semiconductor substrate, for example, a monocrystal silicon substrate or an SOI substrate (SIMOX or the like), and more particularly to the structure of an insulated gate field effect transistor (hereinafter referred to simply as "IG-FET") and a method of manufacturing the same. The present invention relates to a technique of which advantages are especially exhibited in the case of manufacturing a fine device whose channel length is 1 μm or less (representatively, 0.01 to 0.35 μm).

Therefore, the present invention is applicable to a semiconductor integrated circuit such as an IC, a VLSI or a ULSI, which is structured with integrated IG-FETs.

2. Description of the Related Art

In recent years, integrated circuits such as the VLSI are kept on becoming more fine, and the machining dimensions in the order of a deep sub-micron are required, for example, the width of a wiring is 0.18 μm or less, further 0.1 μm or less.

Up to now, the fining of a semiconductor device is progressed in accordance with the scaling rule, and there has been generally known that the fining leads to an improvement in the characteristic of the integrated circuit. However, the fine machining in the order of the sub-micron suffers from a problem that it does not simply accord to the scaling rule.

The representative problem of this type as known is a phenomenon such as a short channel effect. The short channel effect is the phenomenon caused by the reason that as the line width of a gate electrode is shortened, that is, a channel formation region is shortened the charges in the channel formation region becomes to be largely influenced by not only a gate voltage but also the charges in a depletion layer, an electric field and a potential distribution of a source/drain region.

This state is simplified and shown in FIG. 3. Reference numeral 301 denotes a source region, reference numeral 302 denotes a drain region, reference numeral 303 denotes a channel region, and reference numeral 304 denotes a gate electrode. Also, a dotted line indicated by reference numeral 305 represents a depletion layer which is formed when a drain voltage Vd is small.

Normally, a current that flows in the channel region 303 is controlled by only a gate voltage Vg. In this case, as indicated by reference numeral 305, since the depletion layer which is in the vicinity of the channel region 303 is substantially in parallel with the channel, a uniform electric field is formed.

However, as the drain voltage Vd becomes high, the depletion layer which is in the vicinity of the drain region 302 is expanded toward the channel region 303 and the source region 301, with the result that as indicated by a solid line 306, the charge and the electric field in the drain depletion layer become to influence the depletion layer which is in the vicinity of the source region 301 and the channel region 303. In other words, an on-state current is changed according to a complicated electric field distribution, thereby making it difficult to control the current which flows in the channel region 303 by only the gate voltage Vg.

Here, an energy state in the periphery of the channel formation region when the short channel effect occurs will be described with reference to FIG. 4. In FIG. 4, state graphs indicated by solid lines represent energy bands of the source region 401, the channel formation region 402 and the drain region 403, respectively, when the drain voltage is 0 V.

In this state, when the drain voltage Vd which is sufficiently large is applied, the energy bands are changed into the states indicated by dotted lines in FIG. 4. In other words, the depletion charges and the electric field in the drain region 103 which are formed by the drain voltage Vd influence the charges in the depletion layers of the source and channel regions 401 and 402 so that an energy (potential) state is continuously changed from the source region 401 to the drain region 403.

The deterioration of a threshold value voltage (Vth) and a punch-through phenomenon have been well known as an influence of such a short channel effect on the semiconductor device, for example, the IG-FET. Also, there has been known that a sub-threshold characteristic is deteriorated when an influence of the gate voltage on the drain current by the punch-through phenomenon is lowered.

First, the deterioration of the threshold value voltage is a phenomenon that occurs in an n-channel FET and a p-channel FET, similarly. Also, the degree of the deterioration depends on not only the drain voltage but also a variety of parameters such as the concentration of impurities in a substrate, the depth of source/drain diffusion layer, the thickness of a gate oxide film, a substrate bias and so on.

The deterioration of the threshold value voltage is desirable from a viewpoint of lowering a power consumption, however, there generally arises such a disadvantage that a frequency characteristic is not increased because the drive voltage of the integrate circuit becomes small.

Under that circumstance, up to now, as means for controlling the threshold value voltage, it is general to uniformly add the impurity elements that give one conduction to the entire channel formation region, to control the threshold value voltage with the amount of addition of the impurity elements. However, even with this method, the short channel effect per se cannot be prevented, and the punch-through phenomenon is caused to occur. Also, since the added impurities allow carriers to be scattered, the mobility of carriers is caused to be lowered.

Also, the deterioration of the sub-threshold characteristic which is accompanied by the punch-through phenomenon means that the sub-threshold coefficient (S value) is increased, that is, the switching characteristic of an FET is deteriorated. An influence of the short channel effect on the sub-threshold characteristic is shown in FIG. 5.

FIG. 5 is a graph taking the gate voltage Vg in a horizontal axis and the logarithm of the drain current Id in a vertical axis. The inverse number of a slope (sub-threshold characteristic) in the region 501 is an S value. In FIG. 5, the changes of characteristics when gradually shortening the channel length are compared, and the channel length is shortened toward a direction indicated by an arrow.

As a result, there can be confirmed that the slope of the characteristic is decreased, that is, the S value is tended to be increased with the channel length being shortened. This means that the switching characteristic of the FET is deteriorated with the channel length being shortened.

The above-description is made to the short channel effect in the case of extremely shortening the length of the channel formation region of the semiconductor device. In the case of extremely narrowing the width of the channel formation region, the phenomenon such as the narrow channel effect also occurs.

What is shown in FIG. 6 is a cross-sectional view showing a normal IG-FET being cut on a plane perpendicular to the channel direction (a direction connecting the source and, the drain). Reference numeral 601 denotes a monocrystal silicon substrate, and reference numeral 602 denotes a field oxide film formed through the selectively oxidizing method. The respective semiconductor devices used in the VLSI are separated by the field oxide film 602, respectively.

Also, reference numeral 603 denotes a gate electrode to which a voltage is applied to form a channel region 604. Impurity region 605 is disposed below the field oxide film 602 and functions as a channel stopper.

The narrow channel effect is caused in such a manner that a bird beak portion is largely influenced which is an intrusion of the field oxide film 602 and the impurity region 605 into the channel region 604 is largely influenced as the channel width W is narrowed. In particular, there may be cited an increase in the threshold value voltage and a dependency of the effective channel width on a supply voltage.

In the existing semiconductor industry, a semiconductor integrated circuit which has been integrated up to the limit has been demanded, and it is important to which degree the fining of the respective semiconductor devices can be pursued. However, even if a technique to form a fine pattern in the order of the deep sub-micron is formed is developed, the problem of the above-mentioned short channel effect leads to a fatal obstacle that obstructs the fining of the device.

SUMMARY OF THE INVENTION

The present invention has been made in view of the above circumstances, and therefore an object of the present invention is to provide a technique for effectively restraining the short channel effect accompanied by the fining of the semiconductor device, thereby being capable of forming the fine device in the order of the deep sub-micron which was difficult to realize by the short channel effect.

One structure of the present invention as described in the present specification is featured by comprising:
- a source region, a drain region and a channel forming region which are formed using a crystal semiconductor;
- an impurity region artificially and locally in said channel forming region; and
- a gate insulating film and a gate electrode formed on said channel forming region;
    - wherein impurity elements that shift an energy band width (Eg) are added to said impurity region, and a path in which carriers move is controlled by said impurity region.

Also, another structure of the invention is featured by comprising:
- a source region, a drain region and a channel forming region which are formed using a crystal semiconductor; and
- a gate insulating film and a gate electrode formed on said channel forming region;
    - wherein said channel forming region includes a region in which carriers move, and an impurity region which pins a depletion layer that expands from said drain region toward said channel forming region and said source region and which is artificially and locally formed to control a path through which the carriers move; and
    - wherein impurity elements that shift an energy band width (Eg) are added to said impurity region.

Further, another structure of the invention is featured by comprising:
- a source region, a drain region and a channel forming region which are formed using a crystal semiconductor; and
- a gate insulating film and a gate electrode formed on said channel forming region;
    - wherein said channel forming region includes a region in which carriers move, and an impurity region which pins a depletion layer that expands from said drain region toward said channel forming region and said source region and which is artificially and locally formed to control a path through which the carriers move;
    - wherein impurity elements that shift an energy band width (Eg) are added to said impurity region; and
    - wherein said region in which the carriers move includes means for preventing the impurity scattering of the carriers or means for preventing the deterioration of the mobility which is caused by a factor other than the scattering of a lattice of the carriers.

Yet still further, another structure of the invention is featured by comprising:
- a source region, a drain region and a channel forming region which are formed using a crystal semiconductor; and
- a gate insulating film and a gate electrode formed on said channel forming region;
    - wherein said channel forming region includes a region in which carriers move, and an impurity region which is controlled to a predetermined value voltage by the addition of impurity elements and artificially and locally formed to control a path through which the carriers move; and
    - wherein impurity elements that shift an energy band width (Eg) are added to said impurity region.

Further, another structure of the invention is featured by comprising:
- a source region, a drain region and a channel forming region which are formed using a crystal semiconductor; and
- a gate insulating film and a gate electrode formed on said channel forming region;
    - wherein said channel forming region includes a region in which carriers move, and an impurity region which is controlled to a predetermined value voltage by the addition of impurity elements and artificially and locally formed to control a path through which the carriers move;
    - wherein impurity elements that shift an energy band width (Eg) are added to said impurity region; and
    - wherein said region in which the carriers move includes means for preventing the impurity scattering of the carriers or means for preventing the deterioration of the mobility which is caused by a factor other than the scattering of a lattice of the carriers.

Further, still another structure of the invention is featured by comprising:
- a source region, a drain region and a channel forming region which are formed using a crystal semiconductor;
- an impurity region artificially and locally in said channel forming region by addition of impurity elements that shift an energy band width (Eg) in said channel forming region; and
- a gate insulating film and a gate electrode formed on said channel forming region;

wherein said impurity region has an insulating property;

wherein a path in which carriers move is controlled by said impurity region; and wherein said impurity elements are not added or are added by a very small amount in a region other than said impurity region in said channel forming region.

It should be noted that no addition of impurity elements in a region other than the impurity region or a small amount of addition thereof means that a region (semiconductor layer) where a channel is formed is an intrinsic or substantially intrinsic region.

In the present specification, the intrinsic region is directed to a region to which impurity elements that give n-type or p-type and impurity elements such as carbon, nitrogen or oxygen are not intentionally added. Also, the substantially intrinsic region is directed to a region in which a conductive type which is caused even if impurity elements that give n-type or p-type are not intentionally added is offset, or a region that has the same conductive type as that of the source and drain regions in a range where the threshold value can be controlled.

Also, in the present specification, the intrinsic or the substantially intrinsic region is directed to a region where the concentration of phosphorus or boron is $5\times10^{17}$ atms/cm$^3$ or less, and the concentration of carbon, nitrogen or oxygen is $2\times10^{18}$ atms/cm$^3$ or less.

Also, in the present invention, as the above impurity elements, there may be used elements of group XIII (representatively boron) which can function as an acceptor that gives p-type conduction with respect to the n-channel FET. Further, there may be elements of group XV (representatively phosphorus and arsenic) which can function as a donor that gives n-type conduction with respect to the p-channel FET.

The impurity region added with these impurity elements function to change the energy band configuration of the channel region and to either increase or reduce the threshold voltage. Accordingly, the concentration of the added impurity in the impurity region should be sufficiently high to at least control the threshold voltage, for example, $1\times10^{17}$ to $1\times10^{20}$ atoms/cm$^3$, preferably, $1\times10^{18}$ to $1\times10^{19}$ atoms/cm$^3$.

The concentration of the impurity should be at least 100 times as high as the impurity concentration of the substrate (in a typical single crystal silicon substrate, it is about $1\times10^{15}$/cm$^3$), hence, $1\times10^{17}$/cm$^3$ is the lower limit. Also, if the concentration exceeds $1\times10^{20}$ atoms/cm$^3$, it is not desirable in view of the burden of the device.

In the present specification, monocrystal silicon is a representative example of a crystal semiconductor, and the monocrystal silicon includes not only a monocrystal silicon with a grade which is normally used in the level of the current VLSI, but also monocrystal silicon with a higher grade (to the extreme, monocrystal silicon of an ideal state such that it is fabricated in a universal space).

The subject matter of the present invention is to effectively restrain the expansion of a drain depletion layer by an impurity region which is artificially and locally formed from one end (for example, a source region) of the channel formation region toward the other end thereof (for example, a drain region) and substantially in parallel with a channel direction (electric field direction), thereby preventing the punch-through phenomenon and the deterioration of the sub-threshold characteristic accompanied by that phenomenon which are problems in the prior art.

Since the IG-FET of the present invention looks like as if pins of an impurity region are formed in the channel forming region, the present applicant calls it "pining type transistor". In the present specification, "pining" means "restraint", and "to pin" means "to restrain" or "to suppress".

Also, another subject matter of the present invention is to release by artificially producing the narrow channel effect the deterioration of the threshold value voltage which is a representative phenomenon caused by the short channel effect accompanied by the fining of the channel length is What is shown in FIG. 1A is a schematic diagram showing states of a source region, a drain region and a channel forming region of a normal IG-FET when being viewed from, a top surface thereof. Reference numeral 101 denotes a source region, reference numeral 102 denotes a drain region, and reference numeral 103 denotes a channel forming region.

The feature of the present invention resides in that an impurity region 104 is formed in the channel region, which has an elongated shape substantially in parallel with the direction of an electric field from one end toward the other end (for example, from the source region 101 toward the drain region 102). In the present invention, as the impurities to be added, n-type impurity such as phosphorus (P) or arsenic (AS) is used with respect to the p-channel FET whereas p-type impurity such as boron (B) is used with respect to the n-channel FET.

The added impurities form an energy barrier which is locally large in an energy band width within the channel forming region 103. For example, in the case where boron (B) that gives p-type conduction is added with respect to the n-channel FET, an energy band which has been in a state shown in FIG. 15A is changed to a state shown in FIG. 15B, and Fermi level (Ef) is shifted whereby a barrier ΔE becomes a larger barrier ΔE'. It is needless to say that in this case, the shifting of the Fermi level results in the shifting of an energy band in the channel forming region.

This region has an inverse conductivity and provides a satisfactory barrier from the energy viewpoint though its resistance is low. Likewise, in the case where phosphorus or arsenic is added with respect to the p-channel FET, an inverse conductive region is formed so that it can be applied as an energy barrier.

In particular, as shown in FIG. 1A, since the junction region of the drain region 102 and the channel forming region 103 is a region where an electric field is most remarkably changed, it is desirable that the impurity region 104 is disposed at this position. Also, in the case where an electric field caused by the gate electrode reaches the inside of the drain region 102, the impurity region 104 may extend into the drain region 102. Reversely, it is preferable that no impurity region 104 is formed within the source region 101.

Since these impurities combine firmly with the silicon atoms of the substrate, it is unlikely that these impurities rediffuse during a heat treatment.

Further, the present invention is extremely effective in forming a fine device that requires the fine machining in the order of the deep sub-micron such as a size of 0.2 μm, further 0.1 μm, because the length of the channel forming region (the channel length or a distance between the source and the drain) is also shortened to 0.01 to 1.0 μm, representatively, 0.1 to 0.35 μm, the impurity region must be cut into a finer pattern.

For example, in the case of employing a resist mask in formation of the impurity region which is shaped in a linear pattern, a normal light exposing method cannot be used in a pattering process for defining holes in the resist mask from the viewpoint of a problem on resolution. In such a case, patterning may be performed by using an electron drawing method or an FIB method to realize a fine pattern.

Also, since the linear-pattern shaped impurity region is formed to be artificially arranged by patterning, it can be arranged not only as shown in FIG. 1A but also arbitrarily variously arranged.

Then, a description will be given hereinafter of how to restrain the short channel effect in driving an insulated gate semiconductor device (IG-FET) having the structure of the source region/channel forming region/drain region shown in FIG. 1A.

First, a cross-sectional view taken along a line A—A' of FIG. 1A is shown in FIG. 1B. Reference numeral 105 denotes a field oxide film, and reference numeral 106 denotes a channel stopper. Since the impurity regions 104 are formed to bridge the source region 101 and the drain region 102, the impurity regions 104 appear without any interruption in a section taken along a line A—A' as shown in FIG. 1B.

Also, a cross-sectional view taken along a line B—B' of FIG. 1A is shown in FIG. 1C. Reference numeral 107 denotes a field oxide film. Although a depthwise shape of the impurity regions 104 is variable by setting the conditions, this example shows an example in which the impurity regions 104 are in the form of a bar assuming that there is ideally no scattering.

The width of the impurity region 104 is indicated by Wpi,n, and its interval is indicated by Wpa,m. In this example, n and m means that within the channel forming region 103, Wpi, n is a width of the n-th impurity region, and Wpa,m is an interval between the m-th impurity regions (path through which carriers travel).

The above description was made simply to the structure, and its effect will be now described. First, in the case of applying a gate voltage and a drain voltage to a semiconductor device having a structure shown in FIG. 1B, a source side depletion layer 201, a channel side depletion layer 202 and a drain side depletion layer 203 are formed in a state shown in FIG. 2A. In other words, the drain side depletion layer 203 is prevented from expanding toward the source side by an impurity region 204 as a barrier.

Since the impurity region 204 (104) is disposed as shown in FIG. 1A, a model in which a lattice filter that blocks the channel forming region restrains the expansion of the drain side depletion layer facilitates the understanding of the present invention.

Hence, in the semiconductor device having the structure according to the present invention, as shown in FIG. 2A, the depletion layers are divided without being interfered with each other. In other words, since the source side depletion layer 201 and the channel side depletion layer 202 are distributed without being influenced by the drain side depletion layer 203, the energy state becomes a state shown in FIG. 2B.

In other words, since the energy state of the channel region is almost controlled by only an electric field caused by the gate voltage, which is different from the conventional energy state shown in FIG. 5, it has a substantially parallel shape with respect to the channel region. Therefore, with this structure, there arises no problem such as the punch-through phenomenon inherent to the short channel effect, thereby being capable of structuring a semiconductor device high in drain withstand voltage.

Furthermore, as shown in FIG. 2A, in the present invention, because a volume that occupies the depletion layer is reduced in comparison with the prior art shown in FIG. 3, the present invention has the feature that the charges of the depletion layer are smaller than those of the prior art, and that a capacitor in the depletion layer is small. In this example, an expression that leads an S value is represented by the following expression.

$$S=d(Vg)/d(\log 1d) \qquad \text{[Expression 3]}$$

Namely, as described above, it is understandable that the expression represents the inverse number of a slope in the region 501 in the graph shown in FIG. 5. Also, Expression 3 can be approximately represented by the following expression.

$$S=1n10kT/q[1+(Cd+Cit)/\text{Cox}] \qquad \text{[Expression 4]}$$

In Expression 4, k is the Boltzmann's constant, T is an absolute temperature, q is the amount of charges, Cd is a capacity of the depletion layer, Cit is an equivalent capacity of an interfacial level, and Cox is a capacity of the gate oxide film. Hence, according to the present invention, since the capacity Cd of the depletion layer is sufficiently smaller than that of the prior art, the S value can be set to a small value of 85 mV/decade or less (preferably, 70 mV/decade or less), that is, an excellent sub-threshold characteristic can be obtained.

Also, the object of the present invention is to allow the capacity Cd of the depletion layer and the equivalent capacity Cit of the interfacial level to approach 0 as much as possible. In other words, they are allowed to approach an S value (60 mV/decade) in an ideal state of Cd=Cit=0.

Further, it is very important that the channel forming region is structured as shown in FIG. 1C for releasing the deterioration of the threshold value voltage which is caused by the short channel effect. This is because the structure shown in FIG. 1C is a structure necessary for intentionally producing a narrow channel effect.

For example, when attention is paid to a cross section shown in FIG. 1C, the width W of the channel forming region is divided by the impurity region 104 so that it can be substantially regarded as an assembly consisting of a plurality of channel forming regions having a narrow channel width Wpa,m.

Namely, the narrow channel effect can be obtained in the plurality of regions having the narrow channel width Wpa, m. From the macro viewpoint, since the region where the narrow channel effect thus exists in the entire channel forming region as shown in FIG. 1A, it is considered that the narrow channel effect can be obtained as a whole, thus increasing the threshold value voltage.

Hence, even if the threshold value voltage is lowered by the short channel effect which is caused by shortening the channel length, the threshold value voltage is intentionally increased by the narrow channel effect so that the threshold value voltage can be controlled for the above reason, as a result of which a change in the threshold value voltage can be released.

Also, a method of manufacturing an insulated gate semiconductor device in accordance with another aspect of the invention comprises steps of:

forming a source region, a drain region and a channel forming region using a crystal semiconductor;

forming an impurity region artificially and locally in said channel forming region; and forming a gate insulating film and a gate electrode on said channel forming region;

wherein impurity elements that shift an energy band width (Eg) are artificially and locally added to said impurity region, and a path in which carriers move is controlled by said impurity region.

Further, a method of manufacturing an insulated gate semiconductor device in accordance with still another aspect of the invention comprises steps of:

forming a source region, a drain region and a channel forming region using a crystal semiconductor;

forming a gate insulating film and a gate electrode on said channel forming region; and in order to form an impurity region which pins a depletion layer that expands from said drain region toward said channel forming region and said source region and controls a path through which the carriers move, artificially and locally adding impurity elements that shift an energy band width (Eg) to said channel forming region.

A method of manufacturing an insulated gate semiconductor device in accordance with yet another aspect of the invention comprises steps of:

forming a source region, a drain region and a channel forming region using a crystal semiconductor;

forming a gate insulating film and a gate electrode on said channel forming region;

in order to form an impurity region which is controlled to a predetermined threshold value voltage by addition of impurity elements and control a path through which the carriers move, artificially and locally adding impurity elements that shift an energy band width (Eg) to said channel forming region.

A method of manufacturing an insulated gate semiconductor device in accordance with yet still another aspect of the invention comprises steps of:

forming a source region, a drain region and a channel forming region using a crystal semiconductor; and artificially and locally forming an impurity region by addition of impurity elements that shift an energy band width (Eg) in said channel forming region; and forming a gate insulating film and a gate electrode formed on said channel forming region;
  wherein said impurity region has an insulating property;
  wherein a path through which carriers move is controlled by said impurity region; and
  wherein said impurity elements are not added or are added by a very small amount in a region other than said impurity region in said channel forming region.

BRIEF DESCRIPTION OF THE DRAWINGS

These and other objects, features and advantages of the present invention will become more fully apparent from the following detailed description taken with the accompanying drawings in which:

FIGS. 7A to 7E are diagrams showing a process of manufacturing an insulated gate field effect transistor;

FIGS. 8A to 8C are diagrams for explaining conditions for forming impurity regions;

DETAILED DESCRIPTION OF THE PREFERRED EMBODIMENTS

Figure 1A:
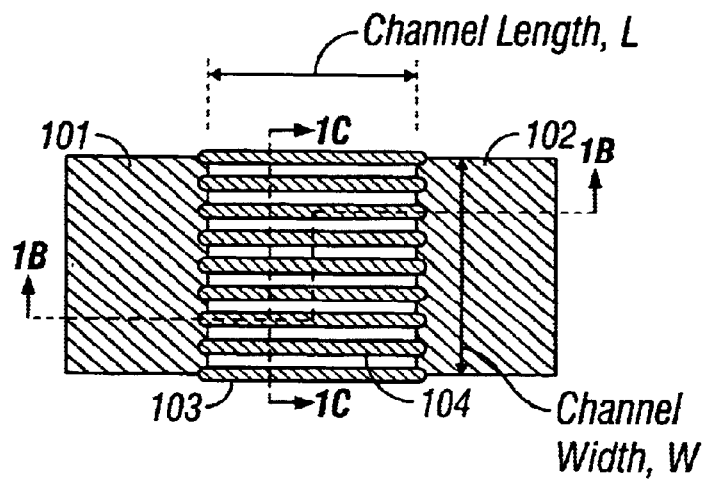
FIGS. 1A to 1C are diagrams showing the structure of a channel forming region.
Figure 1B:
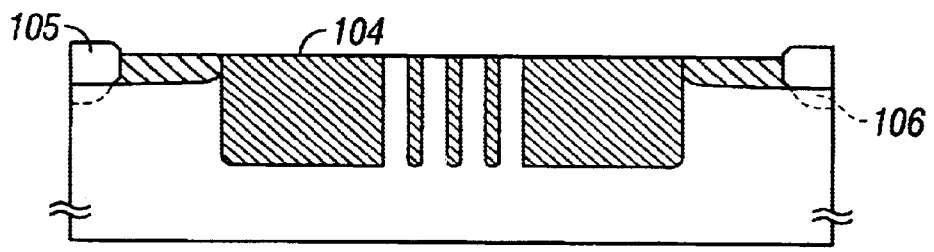
Figure 1C:
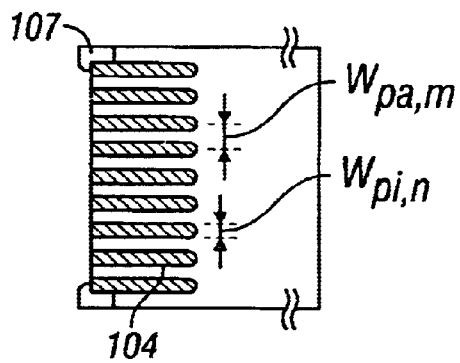
Figure 2A:
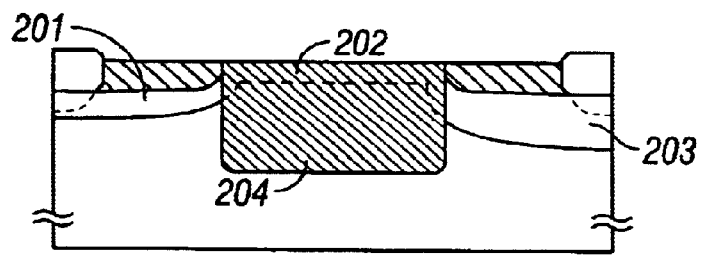
FIGS. 2A and 2B are diagrams showing the structure of the channel forming region.
Figure 2B:
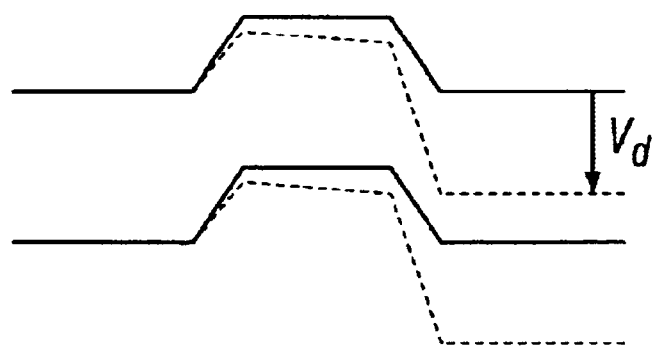
Figure 3:
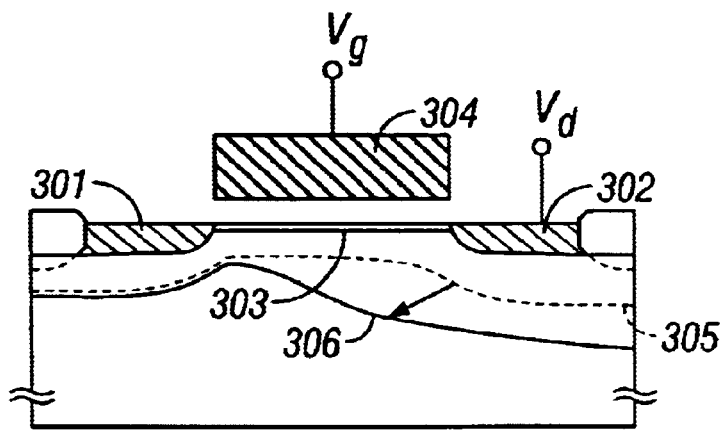
FIG. 3 is a diagram for explaining a conventional semiconductor device.
Figure 4:
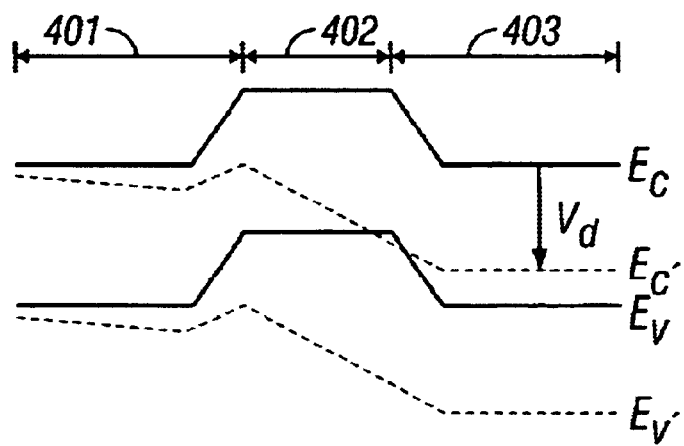
FIG. 4 is a diagram showing an energy state of the channel formed region.
Figure 5:
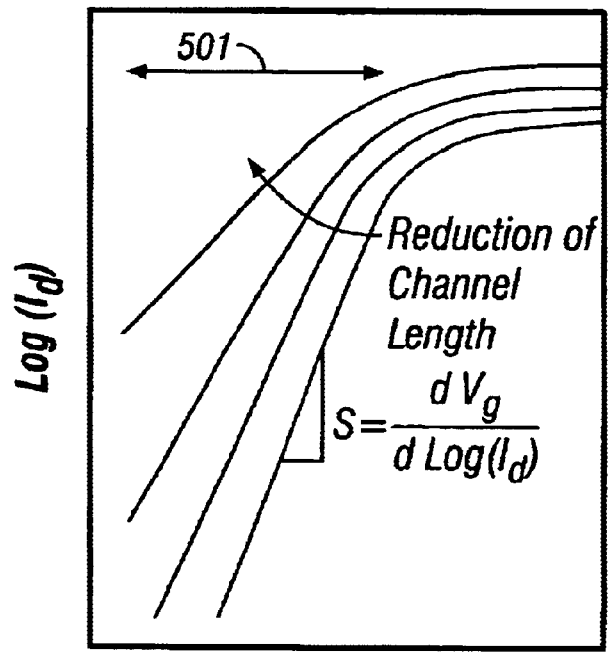
FIG. 5 is a graph showing a characteristic of the conventional semiconductor device.
Figure 6:
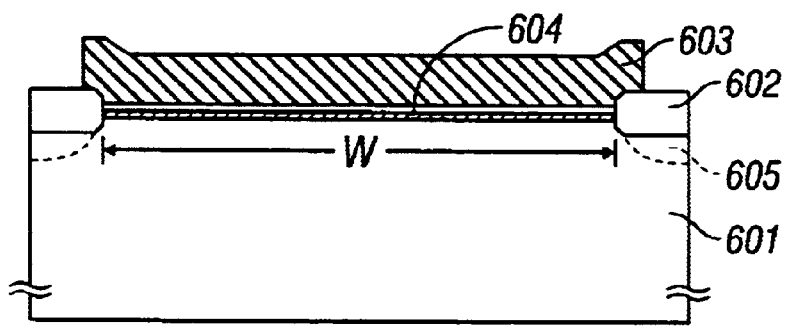
FIG. 6 is a diagram showing the structure of the conventional semiconductor device.

In FIGS. 1A to 1C, a region interposed between a source region 101 and a drain region 102 forms a channel forming region 103. In the present invention, impurities are artificially and locally added to the channel forming region 103 to form impurity regions 104. It should be noted that the impurity region 104 has a linear pattern shape which extends from one end (for example, a source region 101) of the channel formation region 103 toward the other end thereof (for example, a drain region 102) in parallel with the channel direction (electric field direction).

In the present invention, since as the impurities which are added to the impurity regions, boron is used in case of the n-channel FET whereas phosphorus or arsenic is used in case of p-channel FET, there is no case in which carriers pass through the impurity regions having the inverse conduction. In other words, the channel region is formed only between the impurity regions, and the carriers move through the channel regions as a path.

In the case of driving the semiconductor device thus structured, a drain side depletion layer formed in the vicinity of the drain region 102 does not expand laterally (under the channel forming region) because it is stopped by the impurity region 104. In other words, since an energy state (potential state) in the vicinity of the source region 101 and the channel forming region 103 is not influenced by the drain side depletion layer, the respective electric fields are substantially independently formed.

Therefore, the punch-through phenomenon and the deterioration of the sub-threshold characteristic which are caused by so-called short channel effect are prevented, thereby being capable of realizing a high drain withstand voltage.

Also, the impurity region 104 substantially narrows the channel width, and the so-called narrow channel effect is produced between the impurity regions 104. Therefore, the deterioration of the threshold value voltage which is caused by the short channel effect can be released or offset by an increase of the threshold value voltage which is caused by the narrow channel effect.

Further, in the present invention, because the impurity regions 104 shaped in the linear pattern play the role of side walls to control a carrier moving direction, the scattering caused by self-collision between the carriers is reduced. In other words, an improvement in mobility can be expected.

Hereinafter, a description will be given in more detail of preferred embodiments of the present invention with the above structure with reference to the accompanying drawings.

Embodiment 1

An example in which an insulated gate electric field effect transistor is formed on a monocrystal silicon substrate in accordance with the present invention will be described with reference to FIGS. 7A to 7E. In this embodiment, for simplification of description, there is shown an example in which a single n-channel FET is formed on a p-type silicon substrate.

Figure 7A:
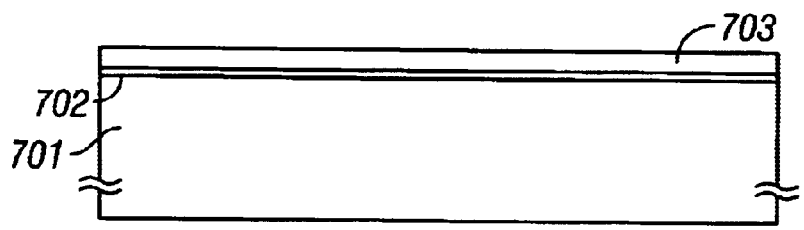

First, reference numeral 701 denotes a p-type silicon substrate on which a silicon oxide film 702 is formed as a pad oxide film on which a silicon nitride film 703 that functions as a mask which will be used later for selective oxidation is further formed. The thickness of the silicon oxide film 702 and the silicon nitride film 703 may be 500 to 2000 Å (FIG. 7A).

Then, patterning is conducted so that the silicon nitride film 703 remains only in the device formation region, and in this state, ions of impurity elements that give p-type conduction are implanted into the substrate. Thereafter, wet oxidation is conducted at a temperature of 1000 to 1100° C.

Figure 7B:
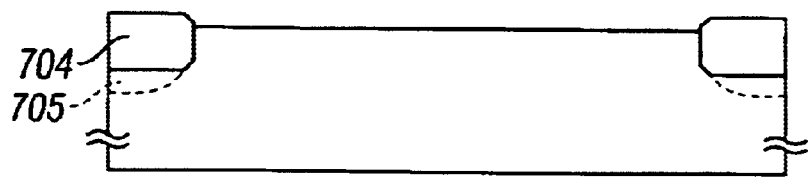

A silicon surface exposed through this process is selectively heat-oxidized to form a field oxide film 704 shown in FIG. 7B. The field oxide film 704 has a function to insultingly separate elements from each other.

Also, the impurity elements (B) that give p-type conduction which have been implanted through the above-mentioned ion implanting process form a channel stopper 705 under the field oxide film 704. This is a region that prevents a channel from being formed under the field oxide film 704, and normally provides the same conduction as that of a host substrate (a p-type silicon substrate in this embodiment).

Then, the silicon nitride film 703 and the silicon oxide film (pad oxide film) 702 are removed to obtain a state shown in FIG. 7B. In the selective oxidizing process of this type, there can be used a variety of selective oxidizing method such as the LOCOS method, the PLANOX method, the Isoplanar method or SWAMI method.

Subsequently, boron that gives an opposite conduction is added to the channel forming region 706 to form impurity regions 707 that function as a stopper of the depletion layer. The region 707 to which the impurity elements are added may be selectively designed such that holes are defined in a resist not shown through patterning. Also, it is desirable to use an ion implantation method in order to form the fine impurity regions 707.

It should be noted that in order to shape the impurity region 707 in a line pattern, an extremely fine lithography technique is required. To achieve this, a light shaped in the line pattern may be exposed using the technique using an electronic beam (electron drawing method) or a technique using an ion beam (FIB method).

In this situation, it is desirable that intervals Wpa, m between the respective impurity regions 707 (refer to FIG. 1C) are made equal with each other. This is because there is a possibility that the threshold value voltage is dispersed (which is caused by the dispersion of the narrow channel effect) or heating is dispersed (which is caused by the dispersion of a density of a current that flows between the impurity regions).

Also, the substrate may be heated during the ion implantation in order to activate the doped impurity. The activation efficiency can by improved by increasing the RF power of the ion implantation.

After completion of addition of the impurities, a heat oxidizing process is conducted to form a heat oxide film 708 of 100 to 500 Å. The thin heat oxide film 708 formed through heat oxidizing process functions as a gate insulating film as it is.

Figure 7C:
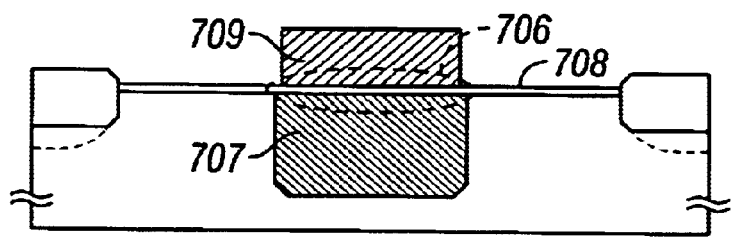

Furthermore, in the channel forming region 706, a polysilicon film is formed on the oxide film 708 as a gate electrode 709. The impurity elements are added to the polysilicon film during the deposition so that the polysilicon film provides conductivity. Thus, a state shown in FIG. 7C is obtained.

Figure 7D:
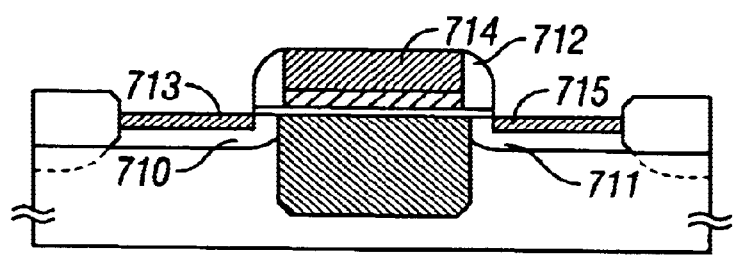

Thereafter, as shown in FIG. 7D, impurity elements (P or As) that give n-type conduction are added to form a source region 710 and a drain region 711 in a self aligning manner. Subsequently, a silicon nitride film is formed in thickness of 3000 Å so as to cover the gate electrode 709, and a side wall 712 is allowed to remain only on both side surfaces of the gate electrode 709 by using the etch back method.

Then, a titanium film is formed on the entire surface through the sputtering method in this state, and silicide is formed through means such as heating, laser annealing or lamp annealing. Through this process, titanium silicides 713 to 715 are formed on the surface of the source region 710 and the drain region 711 and on the surface of the gate electrode 709. Since the titanium silicides 713 to 715 are extremely low resistant, it is preferable to ensure those suicides being in ohmic contact with wirings which will be formed later.

After completion of formation of the suicides, a silicon nitride film 716 is formed as an interlayer insulating film, and contact holes are formed therein to form a source electrode 717 and a drain electrode 718. Thus, an IG-FET having a structure shown in FIG. 7E is completed.

The present invention is characterized in that the impurity region is formed in the form of a linear pattern in the channel forming region of the IG-FET. Positions at which the linear pattern is formed are required to satisfy conditions with a certain limit. This will be described with reference to FIG. 8.

In FIG. 8, reference numeral 801 denotes a part of the channel forming region, where the channel width is indicated by W. In this example, a width which is occupied by a dot pattern 802 in the channel width W is defined by Wpi. The value of Wpi is sufficiently set to, for example, 10 to 100 Å. Also, if the widths of the arbitrary dot pattern 802 are wpi,$_1$, wpi,$_2$, wpi,$_3$, ... wpi,$_n$, then Wpi is represented by the following expression.

$$Wpi = \sum_{n=1}^{n} Wpi, n \qquad \text{[EXPRESSION 1]}$$

In order to achieve the structure of the present invention, since it is required that at least one impurity region is formed in a region other than the end portions of the channel forming region, n is an integer of 1 or more.

A width occupied by regions between a dot pattern (current flowing paths) 803 in the channel width W is defined by Wpa. The value of Wpa can be set to, for example, 100 to 3000 Å (representatively 500 to 1500 Å). Also, if regions 803 between the arbitrary linear pattern are wpa,$_1$, wpa,$_2$, wpa,$_3$, ... wpa,$_m$, Wpa is represented by the following expression.

$$Wpa = \sum_{m=1}^{m} Wpa, m \qquad \text{[EXPRESSION 2]}$$

Since it is required that at least one impurity region is formed in a region other than the end portions of the channel forming region as described above, the channel forming region is divided into two, and m is an integer of 2 or more.

In other words, the total channel width W accomplishes the relations of W=Wpi+Wpa and that (n+m) is 3 or more. Then, the respective relations of W and Wpi, W and Wpa, and Wpi and Wpa desirably satisfy the following conditions together.

Wpi/W=0.1 to 0.9

Wpa/W=0.1 to 0.9

Wpi/Wpa=⅑ to 9

What is meant by those expressions are that Wpa/W or Wpi/W must not be 0 or 1. For example, in case of Wpa/W=0 (the same meaning as that of Wpi/W=1), since the channel forming region is completely closed by the impurity region as shown in FIG. 8B, there comes to a state in which no path through which a current flows exists.

Reversely, in case of Wpa/W=1 (the same meaning as that of Wpi/W=0), since the impurity region does not exist in the channel forming region at all as shown in FIG. 8C, the expansion of the drain side depletion layer cannot be restrained.

For the above reasons, it is desirable that the relational expressions of Wpa/W and Wpi/W fall into a range of 0.1 to 0.9 (preferably 0.2 to 0.8), and also Wpi/Wpa=⅑ to 9 is satisfied. It should be noted that if the channel length is L, a channel formation area is represented by W×L.

Also, in the present invention, that the impurity regions shaped in a linear pattern are arranged as shown in FIG. 1A is very important in an improvement of the mobility which is a representative parameter that exhibits the performance of an FET. The reason will be described hereinafter.

The mobility is determined in accordance with the scattering of carriers in a semiconductor (a silicon substrate in this embodiment), and the scattering in the silicon substrate is roughly classified into the lattice scattering and the impurity scattering. The lattice scattering is low in the concentration of impurities in the silicon substrate and controllable at a relatively high temperature, and the impurity scattering is high in the concentration of the impurity and controllable at a relative low temperature. The entire mobility $\mu$ obtained by influencing them with each other is represented by the following expression.

$$\mu=(1/\mu l+1/\mu i)^{-1} \qquad \text{[EXPRESSION. 5]}$$

The expression 5 means that the entire mobility $\mu$ is reversely proportional to a sum of the inverse number of the mobility $\mu_l$ ($_l$ means lattice) when being influenced by the lattice scattering and the inverse number of the mobility $\mu_i$ ($_i$ means impurity) when being influenced by the impurity scattering.

In this example, in the lattice scattering, if a drift electric field is not much strong, an acoustic phonon plays the significant role, and the mobility $\mu_l$ at that time is proportional to −3/2 power of a temperature as indicated in the following expression. Hence, it is determined in accordance with the effective mass (m*) of the carriers and the temperature (T).

$$\mu_l \propto (m^*)^{-3/2} T^{-3/2} \qquad \text{[EXPRESSION. 6]}$$

Also, the mobility $\mu_i$ caused by the impurity scattering is proportional to 3/2 power of the temperature as indicated by the following expression and inversely proportional to the concentration N$_i$ of the impurities ionized. In other words, the mobility $\mu_i$ can be changed by adjusting the concentration N of the ionized impurities.

$$\mu_i \propto (m^*)^{-1/2} Ni\ T^{3/2} \qquad \text{[EXPRESSION. 7]}$$

According to the above expressions, in the channel dope where the impurities are added to the entire channel forming region as in the prior art, the mobility cannot be increased because of an influence of the impurity scattering. However, in the present invention, since the impurity regions are locally formed, no impurity is added between the adjacent impurity regions (a region having a width of Wpa).

In other words, because the expression 7 logically means that the concentration N$_i$ of impurities of the ionized impurities approaches 0 without limit, the mobility $\mu_i$ approaches infinite without limit. In other words, the expression 5 means that the impurities are reduced to the degree that a term of 1/$\mu_i$ can be ignored, the entire mobility $\mu$ approaches the mobility $\mu_l$ without limit.

Also, it is logically possible that the effective mass (m*) of the carriers is reduced so that the mobility $\mu_l$ is further increased. This is performed by employing a phenomenon by which the effective mass of the carriers (in particular, in case of electrons) is changed depending on the axial direction of a crystal axis in a region of an extremely low temperature.

According to a literature, when it is structured such that a channel direction connecting between the source and the drain (a direction along which carriers are moved) is identical with <100> axial direction of a monocrystal silicon, the minimum effective mass can be obtained.

Figure 16:
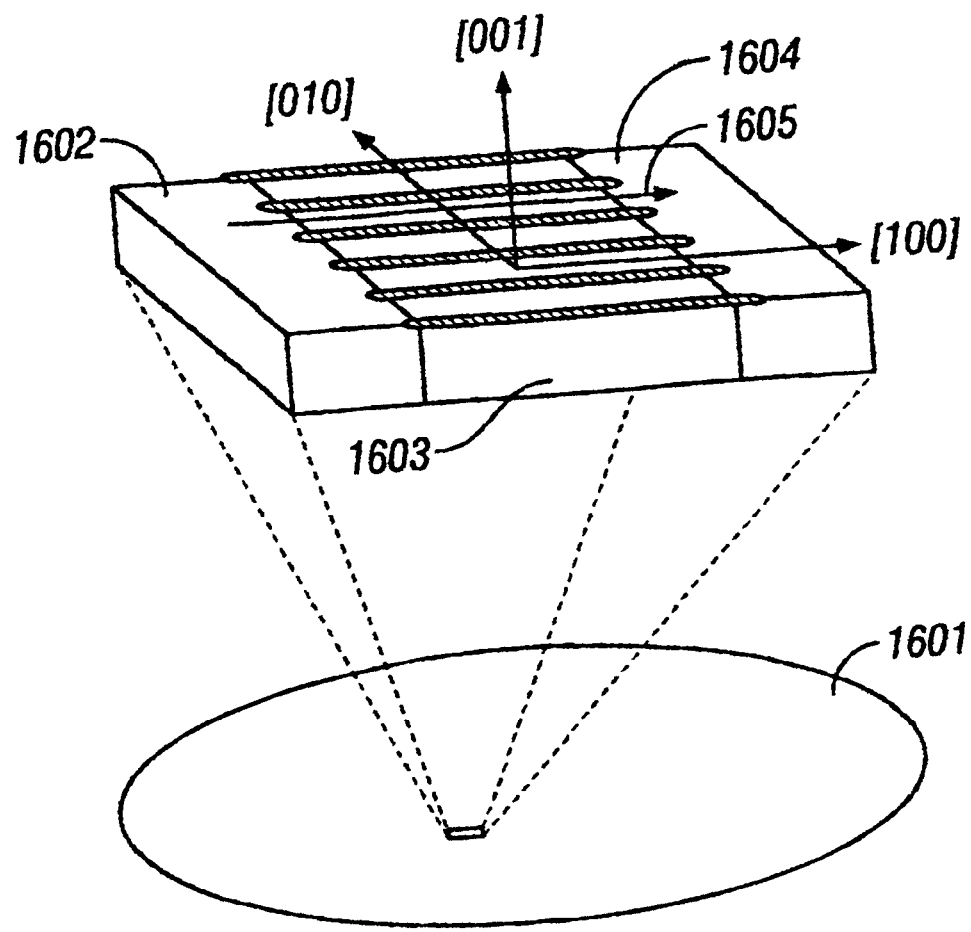
FIG. 16 is a diagram showing the structure of the channel forming region.

For example, as shown in FIG. 16, it is assumed that a monocrystal silicon substrate 1601, a source region 1602 a channel forming region 1603 and a drain region 1604 are formed on a monocrystal silicon substrate 1601 having a (100) face. In this situation, a case in which a channel direction 1605 is [100] corresponds to this example. This example is a result in a region of an extremely low temperature of 4° K.

Also, it is desirable that the channel direction and the axial direction (arranging direction) of the impurity region 707 are made substantially in parallel with the axial direction of the crystal lattices (an axial replacement is within ±10°) so that the carriers well move between the crystal lattices. In case of monocrystal, since the silicon atoms are regularly arranged, the carriers which move in parallel to a direction along which the crystal lattices are arranged are hardly influenced by the scattering of the lattices.

For example, if the rotating axis in the above direction in the monocrystal silicon substrate is 0°, then in case of the rotating axes of 90°, 180° and 270°, the same effect can be obtained.

Also, in the present invention, the impurity regions are formed using P (phosphorus) with respect to the p-channel FET, and because phosphorus has a property of gettering metal elements, it has an effect of removing metal elements, etc., which cause scattering from a path into which a current flows and fixing the removed metal elements to the impurity regions.

As described above, the carriers that move in the channel forming region pass through a region other than the impurity regions which exist within the channel forming region. This appearance will be briefly described with reference to a schematic diagram of FIGS. 17A to 17C.

Figure 17A:
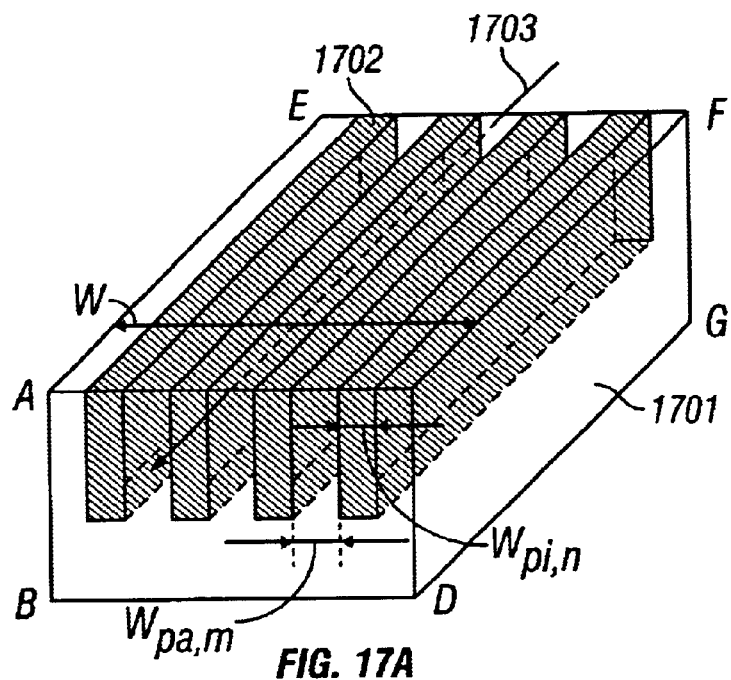
FIGS. 17A to 17C are diagrams showing the structure of the channel forming region.

In FIG. 17A, reference numeral 1701 denotes a channel forming region. In other words, FIG. 17A is a diagram showing the channel forming region viewed from an obliquely right top. The channel forming region according to the present invention has an impurity region 1702 as shown in FIG. 17A, three-dimensionally.

An arrow 1703 shown in FIG. 17A denotes a progressive direction of the carriers (electrons or holes). As shown in FIG. 17A, a plurality of impurity regions 1702 are disposed within the channel forming region 1701, and the carriers pass through a region other than those impurity region 1702.

Figure 17B:
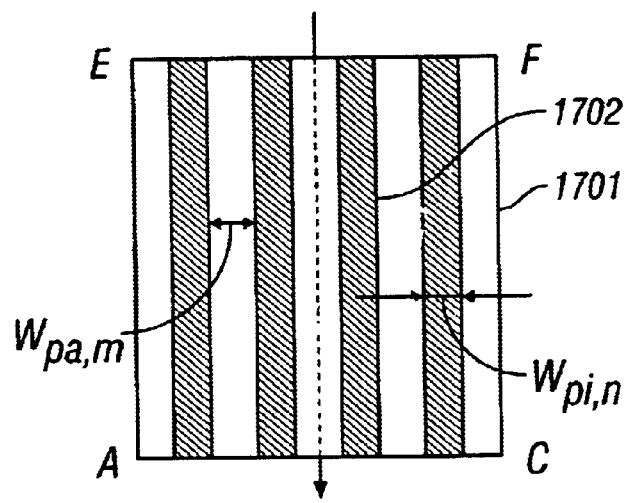

The progressive direction of the carriers looks as shown in FIG. 17B when being viewed from the top surface of the channel forming region 1701. FIG. 17B is a diagram showing a surface indicated by ACEF in FIG. 17A. It is understandable from FIG. 17B that the carriers move in a region having no impurity scattering while avoiding the impurity regions 1702.

That is, as indicated by the arrow, most of the carriers go between the impurity regions 1702 and move between the source and the drain. It is needless to say that the carriers move zigzag such that they avoid the impurity regions.

Figure 17C:
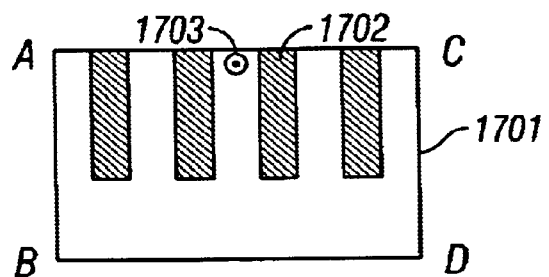

Also, what is shown in FIG. 17C is a diagram viewed from a side surface of the channel forming region 1701. FIG. 17C is a diagram showing a surface represented by ABCD in FIG. 17A. What is denoted by reference numeral 1703 is an arrow which is directed toward this side from the paper. It is understandable from the figure that the carriers move between the impurity regions 1702. It is presumed that a distribution diagram that schematically represents an energy state (potential state) in regions interposed between the respective impurity regions which are shaped in the linear pattern (hereinafter called "potential-slit region") is as shown in FIG. 13A.

Figure 13A:
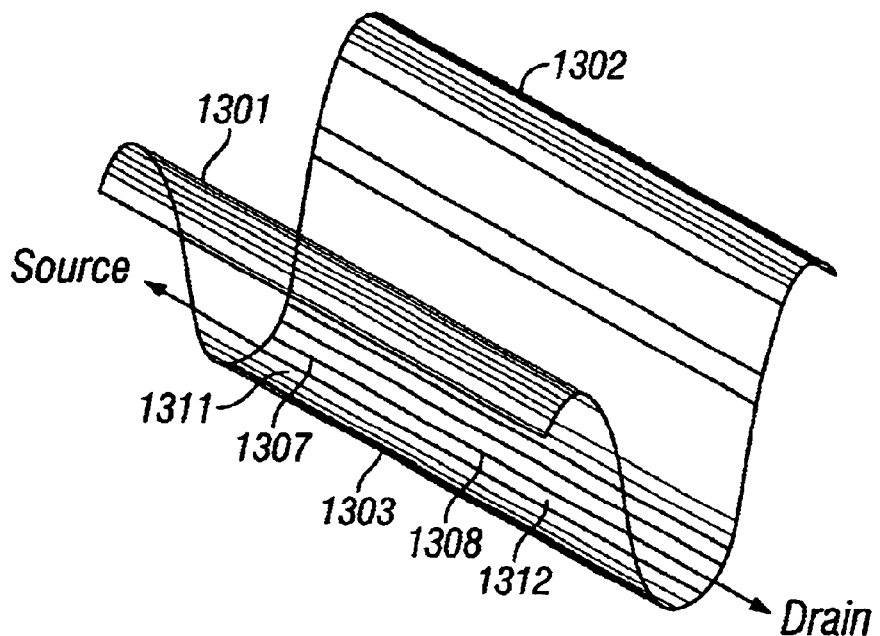
FIGS. 13A and 13B are diagrams showing the structure of the insulated gate field effect transistor.

In FIG. 13A, regions denoted by reference numerals 1301 and 1302 represent energy states of the impurity regions and have high-energy barriers. Then, as the regions 1301 and 1302 are away from the impurity regions, they gradually come to low-energy regions 1303. In other words, carriers that move in the channel region (in this example, electrons) move in a region indicated by reference numeral 1303 which is low in energy state in priority, and energy barriers (impurity regions) indicated by reference numerals 1301 and 1302 play the role of walls.

Figure 13B:
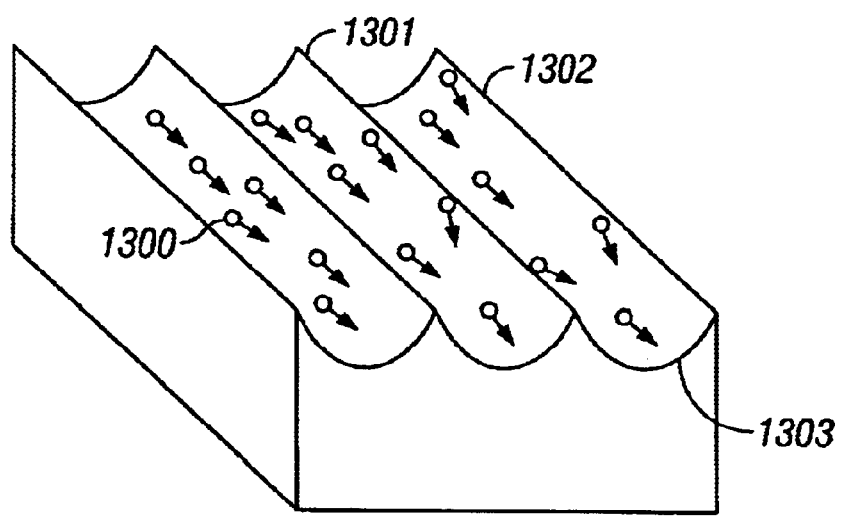

An image of carriers (electrons) that move in the channel region is schematically shown in FIG. 13B. As shown in FIG. 13B, the carriers 1300 that move in the channel region are controlled in their directivity as if they are spheres that roll in an eaves trough, and move from the source region toward the drain region by substantially the shortest distance.

Also, as shown in FIG. 13B, the potential-slit regions shown in FIG. 13A are disposed in a plurality of rows in parallel in the channel formation region, but because they do not exceed regions indicated by reference numerals 1301 and 1032, the carriers do not move between the adjacent potential-slit regions.

For the above reason, since the possibility that the carriers collide with one another is remarkably reduced, the mobility greatly improves. In other words, the structure of the present invention not only reduces the scattering of impurities but also reduces the scattering caused by self-collision between the carriers, thereby being capable of realizing a remarkable improvement of the mobility.

As described above, an idea of the present invention that the energy barrier (grain boundary or the like) which has always adversely affected the operation in the prior art is reversely intentionally formed and employed is very novel.

Embodiment 2

In this embodiment, there is shown an example of structuring a CMOS circuit with a complementary combination of an n-channel FET (NMOS) and a p-channel FET (PMOS) in accordance with the present invention. Although the details of a process of manufacturing the CMOS circuit will be omitted here, the impurity regions shaped in a line pattern is formed only in the channel forming region before forming the gate insulated film according to the present invention, as was described in the embodiment 1.

Figure 14A:
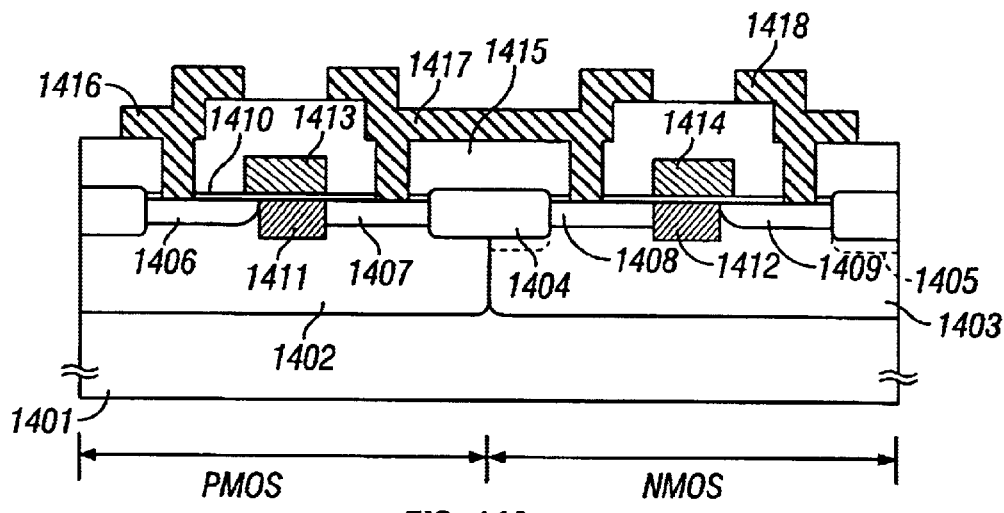
FIGS. 14A and 14B are diagrams showing energy states of the channel forming regions.

FIG. 14A shows a cross-sectional view of a CMOS circuit in accordance with the present invention. FIG. 14A is a cross-sectional view of the CMOS circuit cut along the channel direction, which is formed through a normal manufacturing method.

In FIG. 14A, reference numeral 1401 denotes an n-type silicon substrate, reference numeral 1402 denotes a n-well, and reference numeral 1403 denotes a p-well. In other words, a p-channel FET (PMOS) is formed on the n-well 1402, and an n-channel FET (NMOS) is formed on the p-well 1403.

The NMOS and PMOS are divided by a field oxide film 1404 which has been formed through the selective oxidizing method, respectively, and a channel stopper 1405 is disposed under the p-well side field oxide film.

Also, impurities that give p-type conduction, for example, boron is added to the n-well 1402 so that a source region 1406 and a drain region 1407 of the PMOS are disposed. Further, impurities that give n-type conduction, for example, phosphorus or arsenic is added to the p-well 1403 so that a drain region 1408 and a source region 1409 of the NMOS are disposed.

In the channel forming regions interposed between the source region 1406 and the drain region 1407, and between the source region 1408 and the drain region 1409, respectively, impurity regions 1411 and 1412 shaped in a line pattern are formed before forming a gate insulating film 1410.

The reason why the impurity regions 1411 and 1412 are formed before formation of the gate insulating film 1410 in this embodiment is to prevent an interface between the gate insulating film 1410 and the channel forming region from being damaged. However, a method of adding the impurities through the gate insulating film 1410 can be applied.

It should be noted that in this embodiment, in forming the impurity regions 1311 and 1312, the impurity elements to be added must be properly used for the NMOS and the PMOS. In this embodiment, boron is used with respect to the NMOS, and phosphorus is used with respect to the PMOS. The impurity elements which are added to the PMOS may be arsenic without any problems.

Also, in the case of the CMOS circuit as in the present invention, it is desirable that the impurity regions 1311 and 1312 are formed even within the drain regions 1307 and 1308 as shown in FIG. 13A.

It should be noted that when applying the semiconductor device of the present invention to a device in which the source and the drain are mutually exchanged such as a pixel, the impurity regions may extend to both of the source region and the drain region.

Then, gate electrodes 1413 and 1414 which are made of a conductive material are formed on the channel forming region, and an interlayer insulation film 1415 is formed to cover those gate electrodes 1413 and 1414. Furthermore, contact holes are defined in the interlayer insulating film 1415 so that a source electrode 1416 of the PMOS, a common drain electrode 1417 of the PMOS and the NMOS, and a source electrode 1418 of the NMOS are disposed.

Since the CMOS structure having a structure shown in FIG. 14A can be fined without suffering from a problem such as the short channel effect in accordance with the present invention, an integrated circuit extremely high in the degree of integration can be structured.

Also, there can be structured a BiCMOS circuit made up of the combination of the CMOS circuit shown in FIG. 14A and a bipolar transistor. An example of the BiCMOS circuit formed in accordance with the present invention is shown in FIG. 14B.

Figure 14B:
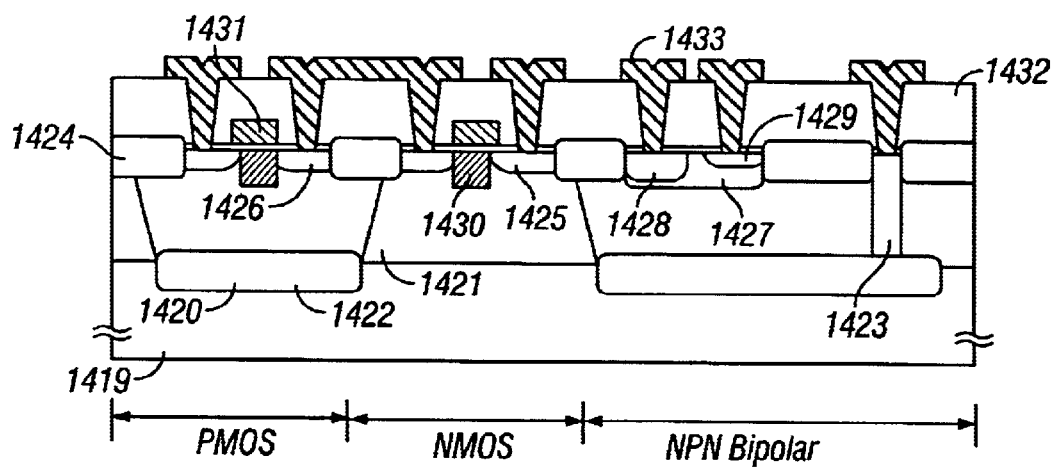

In FIG. 14B, reference numeral 1419 denotes a p-type silicon substrate, reference numeral 1420 denotes a buried n+ region, and reference numeral 1421 denotes a p-well formed through the epitaxial growth. A p-well 1421 on the embedded n+ region 1420 is doped into n-type conduction to form an n-well 1422 that functions as a collector. Also, reference numeral 1423 denotes a deep n+ region that forms an output electrode from the buried n+ region 1420.

Reference numeral 1424 denotes a field oxide film formed through a normal selective oxidizing method. An n+ region 1425 is formed on the p-well 1421, and a p+ region 1426 is formed on the n-well region 1422. On the n-well 1422 on a side where the bipolar transistor is structured, there is first formed a p– region 1427 that forms an active base, and there are then arranged a p+ region 1428 and an n+ region 1429.

It should be noted that an impurity region 1430 is formed in both of the PMOS and the NMOS. The impurity region 1430 may be formed after the above n+ region and the p+ region have been formed, or before they have been formed. Elements of group XIII (representatively, boron) are used for the NMOS, and elements of group XV (representatively, phosphorus or arsenic) are used for the PMOS.

Then, a gate electrode 1431, and interlayer insulating film 1432, and a source/drain wiring 1433 are disposed to structure a BiCMOS circuit. The BiCMOS circuit is structured to effectively use the high-speed operability of the bipolar transistor and the low power consumption property of the CMOS circuit together.

Embodiment 3

In the embodiment 1, a depthwise shape of the impurity region 707 is shaped in a bar. However, this is a shape under an ideal state where no scattering occurs of the ion implantation. In fact, the impurity regions which are variously shaped can be formed depending on conditions when implanting ions.

A section of the channel forming region in the case where the depthwise shape is modified is shown in FIG. 9. FIG. 9 shows a cross-sectional view of the channel forming region taken along a plane perpendicular to the channel direction.

Figure 9A:
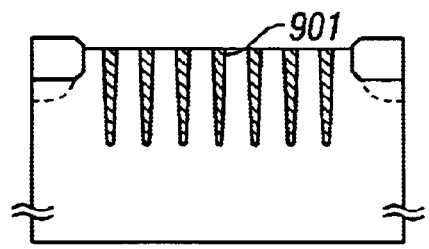
FIGS. 9A and 9B are diagrams for explaining the depth-wise shape of the impurity regions.
Figure 9B:
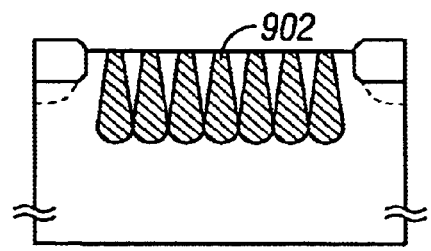

For example, generally, impurity regions 901 which are shaped in wedges as shown in FIG. 9A are formed in the case where the impurities are added through the ion implanting method. Also, reversely, impurity regions 902 which are shaped in droplets as shown in FIG. 9B can be formed. In particular, in case of the shape shown in FIG. 9B, the impurity regions adjacent to each other on a lower portion of the impurity region 902 are in contact with each other.

In this state, it can be substantially regarded as an SOI structure where the channel forming region is insultingly separated from a bulk substrate. This structure can extremely effectively restrain the drain side depletion layer from influencing the depletion layer of the channel forming region. Also, the effect that the depletion layer of the channel forming region is prevented from expanding downward can be expected.

Embodiment 4

In the embodiment 1, as shown in FIG. 1A, there is shown an example in which a plurality of linear patterns (impurity regions) are disposed substantially in parallel with the channel direction (electric field direction) between the source and the drain. However, other various arrangement patterns can be applied by changing the design pattern.

Figure 10A:
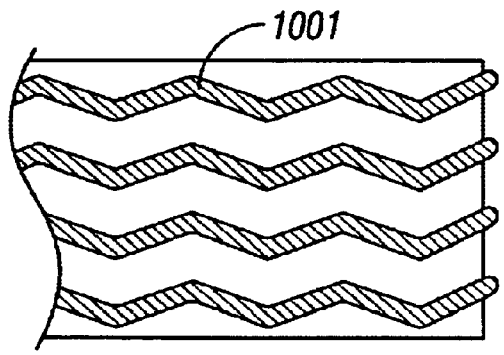
FIGS. 10A to 10B are diagrams for explaining the shape and arrangement of the impurity regions.

For example, as shown in FIG. 10A, the linear pattern 1001 can be disposed zigzag. In this case, since the rate Wpi at which the substantially linear pattern 1001 occupies the channel forming region increases, the lateral expansion of the drain side depletion layer can be effectively prevented. In particular, it is very effective in the IG-FET such that the influence of the short channel effect becomes extremely large as in the case where the channel length is 0.1 μm or less.

However, since a path along which carriers move is meandered, there is a possibility of lowering the mobility as much as a distance of the movement of carriers is increased. However, in a region where the channel length is 0.1 μm or less, at which this structure exhibits the effect, since the carriers going out of the source region reach the drain region in an instant, it is considered that there arises no problem even if the moving distance is somewhat increased.

Hence, it is desirable that in the case where the channel length is, for example, 0.1 μm or longer, the impurity regions shaped in a dot pattern are disposed as shown in FIG. 1A, and in the case where the channel length is 0.1 μm or shorter, they are disposed as shown in FIG. 10A.

Figure 10B:
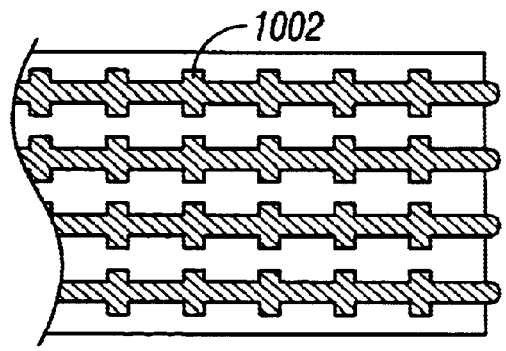

Also, as shown in FIG. 10B, linear patterns 1002 shaped in a fish bone can be disposed. This structure is also effective in preventing the lateral expansion of the drain side depletion layer, and available in a fine device the channel length of which is 0.1 μm or shorter.

Embodiment 5

The present invention is applicable to not only the lateral IG-FET as described in the embodiment 1, but also IG-FETs of various structures. For example, the lateral IG-FET may have other structures such as an LDD (offset) structure (FIG.

11A), a double-drain structure (FIG. 11B), a buried channel structure (FIG. 11C), an SOI structure (FIG. 11D), an SIMOX structure (FIG. 11E) or the like.

In this embodiment, a case in which an n-channel FET is applied to the above structure as an example will be described. In the figure, N+ and N− represent the relative strength of the n-type conductivity, and N+ means the n-type conductivity stronger than N−.

Figure 11A:
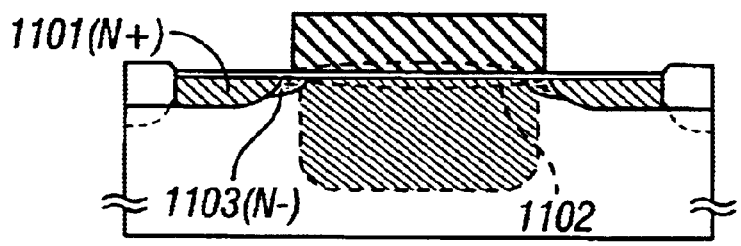
FIGS. 11A to 11E are diagrams showing the structure of the insulated gate field effect transistor.

FIG. 11A shows a structure in which a light doped impurity region 1103 is disposed between a source or drain region 1101 and a channel forming region 1102. Although the drain side depletion layer is liable to gently expand because the low-density impurity region 1103 exists, the present invention can restrain its expansion.

Figure 11B:
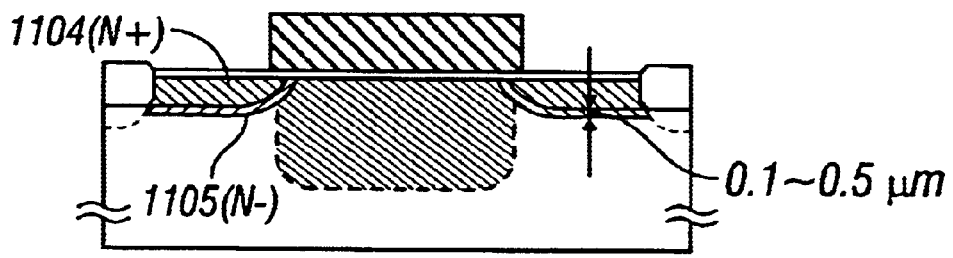

Also, FIG. 11B shows a structure in which conductive regions 1105 having a width of 0.1 to 0.5 µm are formed on both sides of a source or drain region 1104. The source or drain region 1104 is identical in conductivity with the conductive region 1105, and the conductive region 1105 is weaker in conductivity than the source or drain region 1104. For example, As (arsenic) is implanted to form the source or drain region 1104, P (phosphorus) is implanted to form a weak conductive region 1105.

Figure 11C:
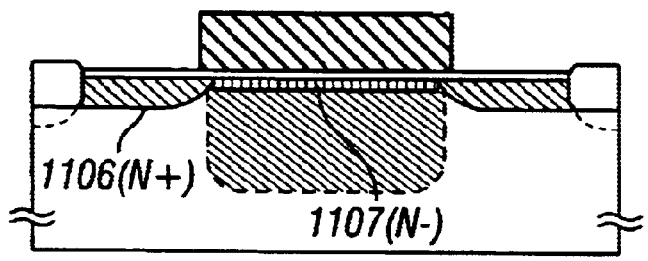

There are many cases in which the buried channel structure shown in FIG. 11C is formed resultantly when a CMOS circuit is structured by an n-channel FET and a p-channel FET, and such a structure is liable to be influenced by the short channel effect.

Structurally, for example, in the n-channel FET, a conductive region 1107 which is identical in conductivity with and weaker in conductivity than the source/drain region 1106 is formed in the vicinity of an interface of the channel forming region.

Therefore, a channel is formed immediately below the conductive region 1107, and similarly in this case, the present invention is implemented with the results that the short channel effect can be restrained, and the punch-through phenomenon and the deterioration of the threshold value voltage can be prevented.

Figure 11D:
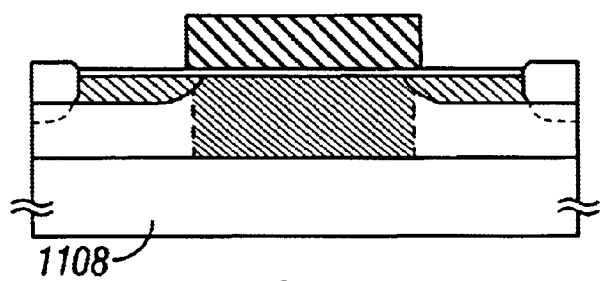

Further, since the SOI structure is of a technique which has been developed with a purpose of thinning the semiconductor layer which is used as a device to reduce the depletion layer, the SOI structure per se provides the effect of restraining the short channel effect. For example, the structure shown in FIG. 11D is generally called "SOS (silicon-on-sapphire) structure", which is formed by allowing silicon monocrystal to grow on a sapphire substrate 1108.

However, it is difficult to form a monocrystal silicon layer of 1 µm or less, and there is a limit of restraining the expansion of the depletion layer. Therefore, if the present invention is applied to the SOI structure, it is possible to more surely prevent the short channel effect.

Figure 11E:
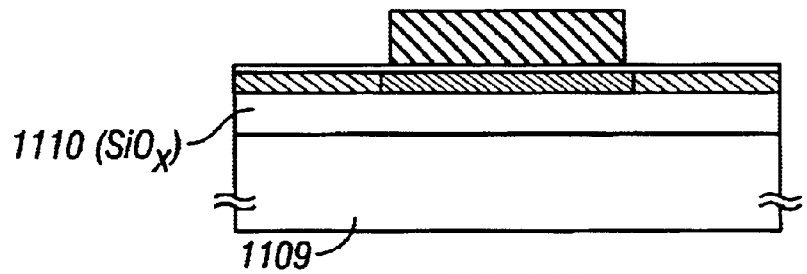

An example in which an IG-FET is formed on a substrate which is generally called "SIMOX (separation-by-implanted oxygen) although it belongs to the above-mentioned SOI structure is shown in FIG. 11E. In this example, oxygen is implanted into a monocrystal silicon substrate 1109, to thereby form an embedded oxide layer 1110. Also, a depth of implantation of oxygen is made shallow, thereby being capable of forming a monocrystal thin film which is extremely thin.

Even in the above example, the present invention is applicable thereto. In this case, there can be expected such an effect as to restrain (pin) the expansion of the drain side depletion layer toward the channel forming region.

Embodiment 6

In the present invention, as a means for forming an impurity region in the channel forming region, there can be applied a method of employing a property that impurities are segregated by a distortion, a property that the impurities are taken into an oxide, or other properties, other than a method of patterning with a resist mask.

First, a state identical with that shown in FIG. 7B is obtained in accordance with a process described in the embodiment 1. Namely, in FIG. 12A, reference numeral 1201 denotes a silicon substrate, reference numeral 1202 denotes a field oxide film, and reference numeral 1203 denotes a channel stopper. Incidentally, FIG. 12 is a cross-sectional view of the channel forming region taken along a plane perpendicular to the channel direction.

Figure 12A:
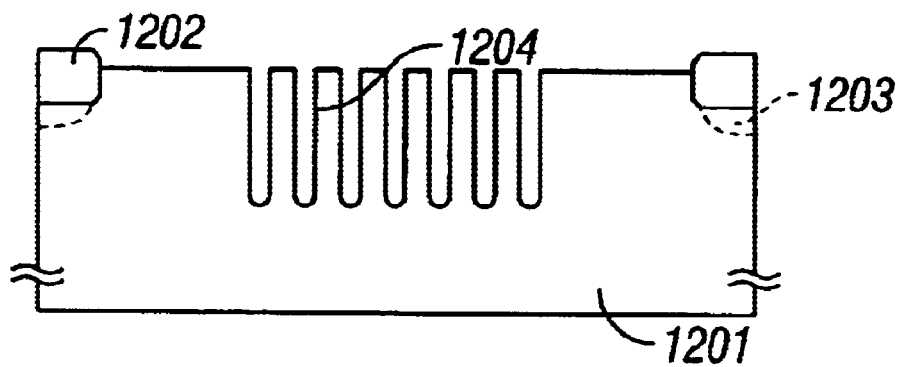
FIGS. 12A to 12C are diagrams showing a process of manufacturing the impurity regions.

In this state, an anisotropic etching process is conducted locally on the surface of a silicon substrate by using a convergent ion beam or the like, to thereby draw a slit-like (grove-like pattern) 1204 in a desired shape at a desired position (FIG. 12A).

Figure 12B:
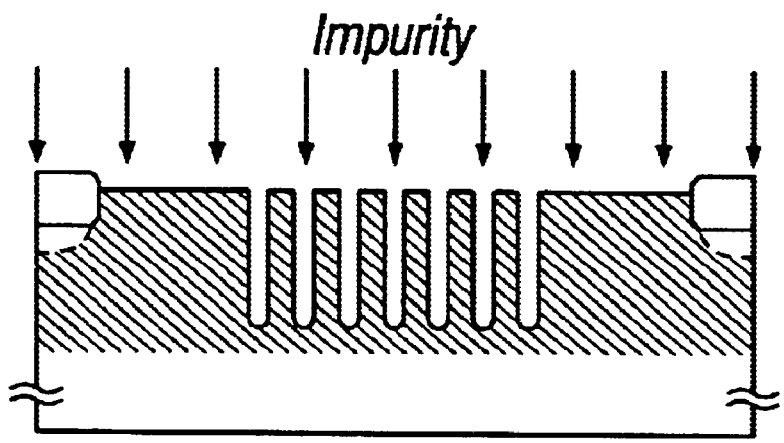
Figure 12C:
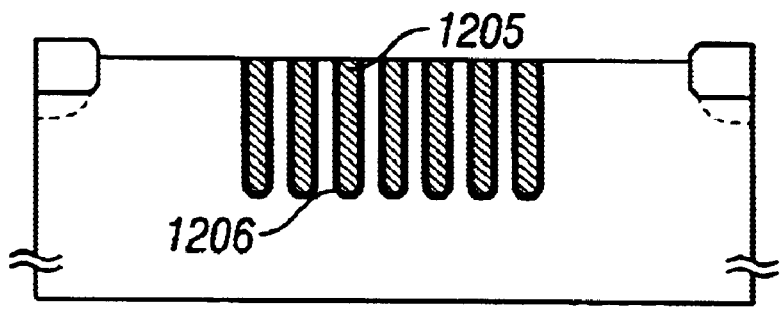

Next, the impurity elements (in this example, boron) are added to the entire surface of the substrate 1201 in a concentration from $10^{16}$ to $10^{18}$/cm$^3$. The impurity elements are used to form the impurity regions of the n-channel FET later. Also, it is desirable that a depth of implantation is deeper than the groove-like or hole-like pattern 1204 (FIG. 12B).

After completion of addition of the impurity elements, a heat treatment is conducted at a high temperature of about 1000 to 1200° C. Through this heat treatment, a heat oxide film is formed on both side walls of the slit-like pattern 1204 so that the slit-like pattern 1204 is embedded. Therefore, this region substantially comes to an oxide region 1205 as represented by SiOx. In this case, it is preferable that the heat treatment is conducted in an oxidation atmosphere because a rate of forming the oxide region 1205 increases.

Simultaneously, the impurity elements (boron) which have been added to the entire silicon substrate 1201 are taken into the oxide region 1205. How is the distribution of the concentration of boron or phosphorus in the vicinity of an interface between the heat oxide film and silicon will be described with reference to FIG. 18.

As shown in FIG. 18, the added ions (B, P) that exist in Si are re-distributed when an oxide film is formed thereon. This is a phenomenon that occurs because the solubility and the rate of diffusion of the added ions are different in silicon (Si) and the heat oxide film (SiOx). Assuming that the solubility of the impurities in Si is $[C]_{Si}$ and the solubility of the impurities in SiOx is $[C]_{SiOx}$, the equilibrium segregation coefficient m is defined by the following expression.

$$m=[C]_{Si}/[C]_{SiOx}$$

Figure 18A:
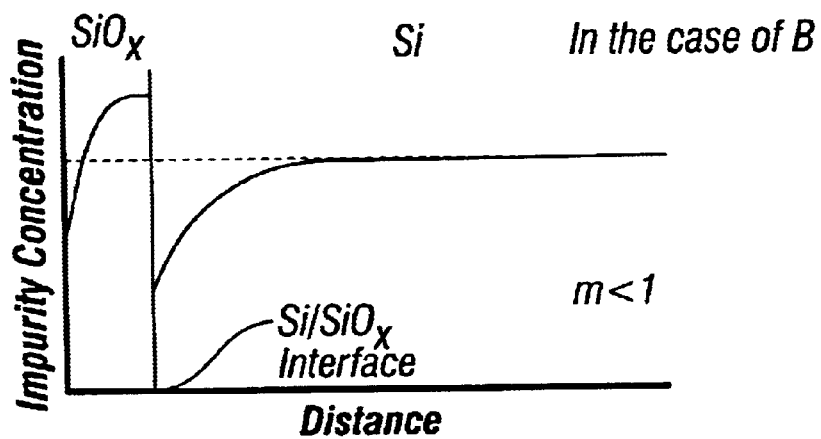
FIGS. 18A and 18B are diagrams for explaining a state of segregation of impurities.

In this case, the segregation of the impurities in the vicinity of an interface between Si and SiOx is controlled by a value of m. Normally, assuming that the diffusion coefficient of the impurities in Si is sufficiently large, in case of m<1, the impurities in Si are taken into $SiO_2$ (FIG. 18A). Also, in case of m>1, SiOx excludes the impurities, as a result of which the concentration of the impurities in the vicinity of the interface increases (FIG. 18B).

According to a literature, the value of m of boron is about 0.3, and the value of m of phosphorus is about 10. Hence, the distribution of concentration of boron after the heat oxidizing process is exhibited as shown in FIG. 18A, and boron is taken into the heat oxide film in such a manner that the concentration of boron on both of side surfaces of the impurity regions 1206 (in the vicinity of the interface between Si and SiOx) comes to a state where its amount is very small. Reversely, a large amount of boron is contained in the oxide 1205 formed.

Although such a phenomenon that boron is taken into the heat oxide film has already been known, an idea of employing the phenomenon in order to form an energy barrier (an impurity region) as in the present invention is completely novel.

Figure 18B:
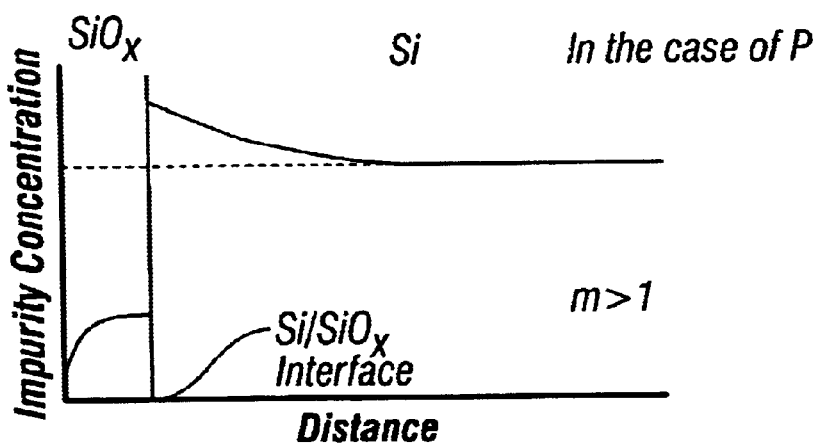

It should be noted that as shown in FIG. 18B, in the case of using phosphorus as the impurity elements, phosphorus is segregated (piled up) to the interface of the oxide film and silicon. The phenomenon can also be applied in forming the impurity regions in the p-channel FET.

Also, in the case where the impurity elements that give one conductivity such as phosphorus or boron are added to the monocrystal silicon substrate 1201 in order to give conduction to the monocrystal silicon substrate 1201, the phenomenon of segregating phosphorus or boron to an oxide is employed as in the present invention, thereby being capable of remarkably improving the mobility.

This is because when this embodiment is implemented, since the impurities (phosphorus or boron) in the periphery of the impurity region (representatively an oxide represented by SiOx) are caused to be collected in the impurity regions, an influence of scattering of the impurities in a region where carriers move between the impurity regions can be remarkably reduced.

Since this means that $\mu_i$ increases in expression 5 as described above, the entire mobility $\mu$ approaches $\mu=\mu_l$. In other words, an extremely large mobility can be realized which is substantially determined by only scattering of the lattice.

Also, other than a method of forming the groove as in this embodiment, there can be applied, for example, the following method. Using a device which is capable of conducting ion implantation in a maskless manner such as a convergent ion beam, oxygen ions are directly implanted into a monocrystal silicon substrate to conduct a heat treatment, thereby being capable of changing the region into which ions are implanted into an oxide region. The convergent ion beam may be replaced by an electron beam or the like.

Embodiment 7

This embodiment shows an example in which the semiconductor device of the present invention is installed into a product (an electronic equipment). In this case, an example of an IC circuit installed into a note-type personal computer will be described with reference to FIG. 19.

Figure 19:
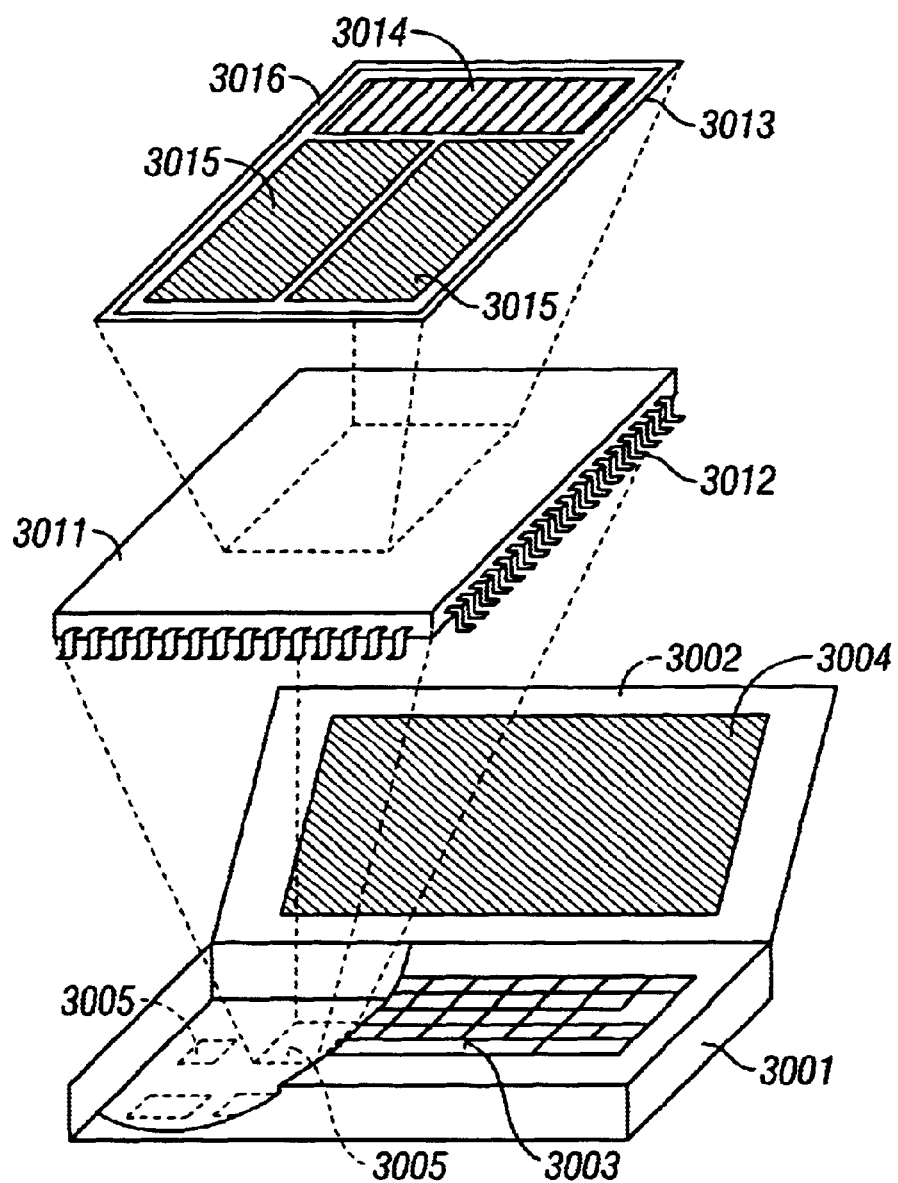
FIG. 19 is a diagram showing an applied example of he semiconductor device.

In FIG. 19, reference numeral 3001 denotes a main body, reference numeral 3002 denotes a cover section, reference numeral 3003 denotes a key board, and reference numeral 3004 denotes an image display section, where a variety of integrated circuits 3005 are installed into the main body 3001.

Drawing out the integrated circuit 3005 from the main body, an external of the integrated circuit 3005 is covered with a package 3011, and an internal semiconductor chip is protected with resin or the like. Also, the internal semiconductor chip is connected to the external through leads 3012. Normally, when the integrated circuit (IC chip) 3005 is viewed, since only the black, package 3011 and the leads 3012 can be viewed from the external, the integrate circuit 3005 is completely a black box.

Drawing out the semiconductor chip protected with the package 3011 from the main body, it is structured, for example, as follows. First, an arithmetic operating section (processor) 3014 and a memory section 3015 are disposed on a substrate 3013. Reference numeral 3016 denotes a bonding section where the semiconductor device and the leads 3012 are connected to each other.

Figure 15A:
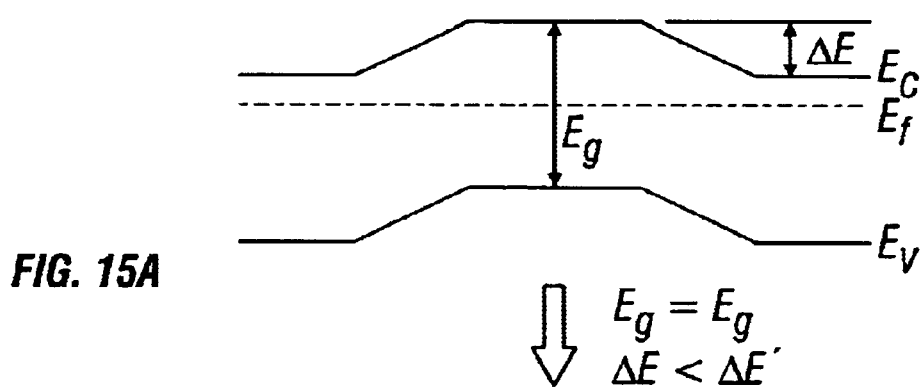
FIGS. 15A and 15B are diagrams showing the structure of the channel forming region.
Figure 15B:
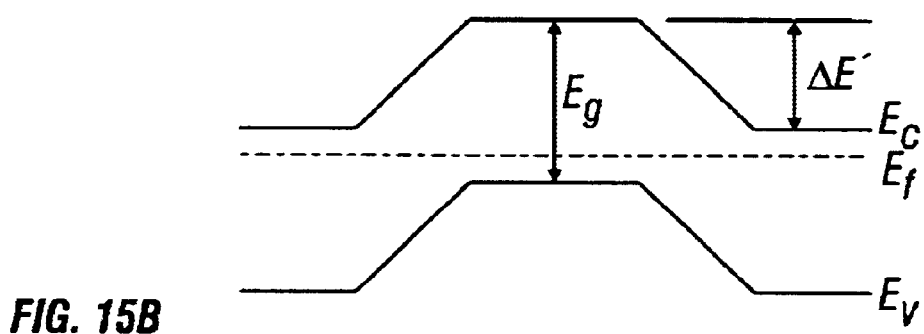

The arithmetic operating section 3014 and the memory section 3015 are made up of a variety of circuits including a CMOS circuit, a BiCMOS circuit, a DRAM circuit, an SRAM circuit and the like. The structure of this embodiment as shown in FIG. 15 is characterized in that the arithmetic operating section 3014 and the memory section 3015 are disposed on the same substrate.

When the arithmetic operating section 3014 and the memory section 3015 are arranged to be adjacent to each other as described above, because a delivery of data between the arithmetic operating section 3014 and the memory section 3015 is conducted at a very high speed, it is possible to form a circuit high in operating speed.

Also, since all the circuits as required can be integrated on one chip, it can be expected that the manufacture costs can be remarkably reduced. Furthermore, an arrangement area is reduced with the result that the product can be downsized.

Since, according to the present invention, the semiconductor device can be fined without suffering from a problem such as the short channel effect, the semiconductor electronic equipment can be further downsized and made portable with being used as the above-mentioned one chip.

Embodiment 8

The present invention can be applied to a variety of semiconductor electronic equipments other than the example described in the embodiment 7. This is because the electric characteristics of the semiconductor device according to the present invention are very excellent, and the IC circuit structured using that semiconductor device can realize a high frequency characteristic.

The device characteristic of the single semiconductor device formed according to the present invention is very excellent, and the threshold value voltage Vth,n of the n-channel FET and the threshold value voltage Vth,p of the p-channel FET can be adjusted within a range of −0.5 to 3.0 V and within a range of −0.3 to 0.5 V in accordance with a required drive voltage, respectively. Also, the S-value as obtained is 60 to 85 mV/decade, preferably, 60 to 70 mV/decade.

Also, for the reason described in Embodiment 1, a high mobility (1000 $cm^2$/Vs or more) can be obtained. In the case where the mobility is obtained through an arithmetic expression, attention must be paid because the mobility is in reverse proportion to the channel width W. In the case where the present invention is implemented, since the channel width is somewhat narrowed by the impurity regions in the channel forming region, the actual mobility cannot be obtained unless the channel width is replaced by the actually measured channel width Wpa.

When the IC circuit is made up of the semiconductor device of the present invention, which can achieve the excellent electric characteristics as described above, a remarkably excellent frequency characteristic can be obtained. For example, when a 9-stage ring oscillator is made up of the semiconductor devices of the present invention, the frequency characteristic of 2 to 10 GHz can be realized with a drive voltage of 3.3 V.

For example, the present invention is effective to an electronic equipment that requires a high frequency characteristic as in a portable telephone which is a high-frequency electronic equipment. Although an IC circuit used for an input section, etc., of the portable telephone requires the frequency characteristic of 2 GHz, the present invention can be satisfactorily applied to the high-frequency IC circuit of this type.

Embodiment 9

In this embodiment, another structure in the case of applying the present invention to an SOI structure described in the embodiment 5 will be described. In particular, this embodiment is structured so that elements which are identical with that of the impurity regions for pining are added to an insulating layer (or an insulating substrate) which forms an under layer of a monocrystal silicon layer (active layer).

It should be noted that this embodiment shows an example in which the above impurity regions are formed with addition of boron in the n-type semiconductor device. It is needless to say that in case of the p-type semiconductor device, phosphorus (or arsenic) may be added to the impurity region.

Figure 20A:
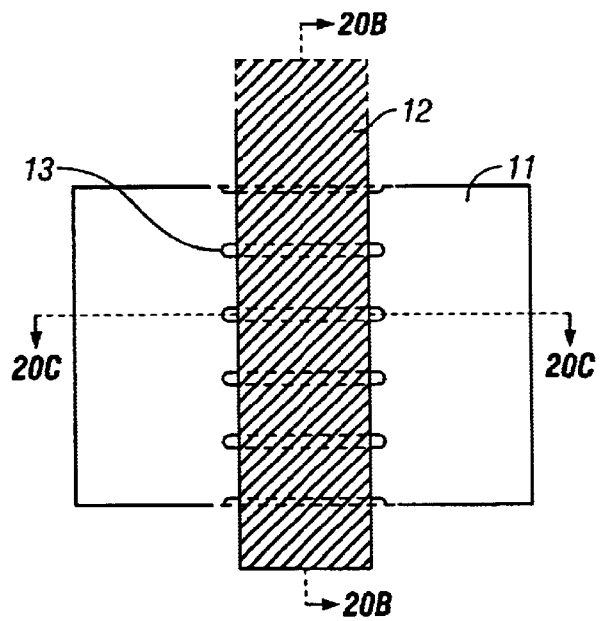
FIGS. 20A to 20C and FIGS. 21A to 21C show an IGFET and an energy state diagram in accordance with the 9th example of the invention.
Figure 20B:
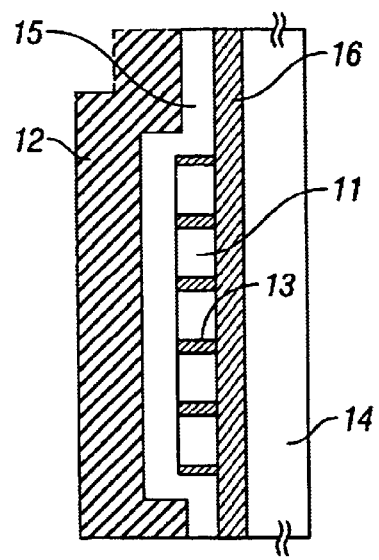
Figure 20C:
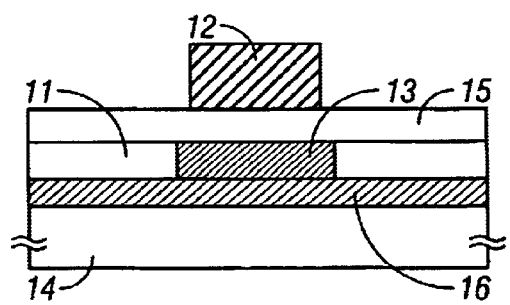

First, the structure of the semiconductor device according to this embodiment is shown in FIGS. 20A, 20B and 20C. FIG. 20A shows a top view of the structure, FIG. 20B is a cross-sectional view taken along a line A—A' of FIG. 20A, and FIG. 20C is a cross-sectional view taken along a line B-B' of FIG. 20A.

In FIG. 20A, reference numeral 11denotes a monocrystal silicon layer (in fact, a gate insulating layer exists thereon), reference numeral 12 denotes a gate electrode, and reference numeral 13 denotes an impurity region for pinning.

Also, in FIG. 20B, reference numeral 14denotes a substrate, reference numeral 15 denotes a gate insulating film, and reference numeral 16 denotes an insulating layer that forms an under layer of the monocrystal silicon layer. The feature of this embodiment resides in that elements identical with those of the impurity regions 13 are added to all of the insulating layer 16 or at least a part in the periphery of the surface thereof.

Incidentally, the reference numerals shown in FIG. 20C correspond to parts described in FIGS. 20A and 20B, and therefore its description will be omitted.

Figure 21A:
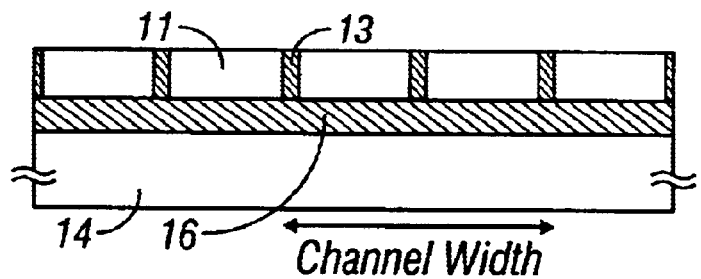

In this example, to describe this embodiment in more detail, an enlarged channel forming region (the monocrystal silicon layer 11 and the periphery of the impurity region 13) of a cross-sectional view of FIG. 20B is shown in FIG. 21A.

What is shown in FIG. 21A is a cross-sectional view of the channel forming region taken along a plane perpendicular to the channel direction. In other words, during operation, carriers (electrons or holes) move in a direction perpendicular to the paper surface.

As described above, in FIG. 21A, reference numeral 14 denotes a substrate, and reference numeral 16 denotes an insulating layer (in this example, an oxide film), on which a monocrystal silicon layer 11 that functions as the channel forming region is disposed. Then, boron is locally added to the monocrystal silicon layer 11 to form impurity regions 13 for pinning.

In this situation, the feature of the present invention resides in that boron is contained in the insulating layer 16. The method of manufacturing this structure is various depending on the process of manufacturing the SOI structure, and hereinafter a case of a wafer joint SOI will be described in brief.

In case of the wafer joint SOI, first a silicon substrate on which a heat oxide film is formed (a first substrate) and a silicon substrate (a second substrate) that supports the heat oxide film are prepared. At this time, in forming the heat oxide film on the first substrate, the heat oxidizing process is conducted in an atmosphere containing boron. Through that process, boron is added into the heat oxide film.

After the first and second substrates are thus prepared, both substrates are bonded together by known methods, and then the first substrate is etch-backed (polished) from the back surface to the predetermined position, thereby being capable of obtaining the SOI structure.

After the first and second substrates are thus obtained, boron is locally added through ion implantation or the like to form an impurity region for pinning, thereby being capable of obtaining the structure shown in FIG. 21A.

Figure 21B:
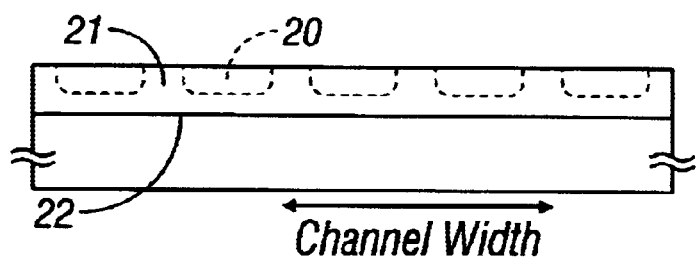

In this example, the energy state of FIG. 21A is schematically shown in FIG. 21B. In FIG. 21B, reference numeral 20 denotes a region which is low in energy barrier (potential slit region) and functions as a channel formation region.

Also, a region 21 high in energy barrier is formed in the impurity region or in the vicinity thereof and plays the role of an energy wall. Incidentally, what is indicated by reference numeral 22 is an interface between the monocrystal silicon layer 11 and the insulating layer 16.

As described in the embodiment 1, because the impurity region 13 forms a barrier high in energy in the vicinity thereof, carriers are moved along the barrier. This is applied to the insulating layer 16 containing boron, and the energy barrier on the interface between the monocrystal silicon layer 11 and the insulating layer 16 becomes high.

As a result, a region 21 high in energy barrier is formed in the shape shown in FIG. 21B, and carriers are moved in other regions, that is, a region 20 low in energy barrier.

Figure 21C:
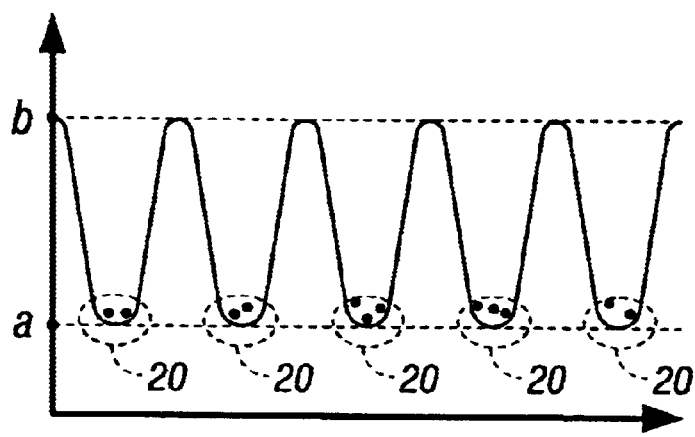

Furthermore, the energy distribution in the channel forming region is shown in FIG. 21C. FIG. 21C shows a graph of an energy distribution with a horizontal axis indicating a distance in the channel width direction (a direction transverse to the channel) and a vertical axis indicating a relative energy.

It should be noted that the schematic diagram of the energy state shown in FIG. 21B and the graph of the energy distribution shown in FIG. 21C are described such that they correspond to each other. In other words, the energy state of the potential slit region 20 shown in FIG. 21B corresponds to the energy state of a region where carriers moved in FIG. 21C.

In this situation, in the interior of the potential slit region 20 (in particular, a portion farthest from the impurity region), the relative energy is the smallest (corresponding to a). Also, the impurity region and a portion in the vicinity thereof (a region indicated by reference numeral 21) have a relative energy corresponding to b.

In case of the present invention, it is preferable that the relative energy (b) is 3 times or more as much as the relative energy (a) (more preferably, 10 times or more). This enables the movement of the carriers to be effectively regulated.

In this embodiment, the wafer bonded SOI is exemplified but the effect of this embodiment is obtained if at least the structure shown in FIG. 21A is obtained. In other words, the present invention is applicable even to the SOI structure manufactured by another method.

Also, this embodiment shows a structure in which the insulating layer that forms the under layer of the monocrystal silicon layer contains the impurities as a whole, but the effect of the present invention can be obtained if there exists impurities on at least an interface between the monocrystal silicon layer and the insulating layer.

Embodiment 10

The structure shown in the embodiment 9 can also be applied to the semiconductor device which is driven by the buried channel type. In this case, carriers is structured as if it moves within the tunnel of the energy barrier.

Also, the embodiment 9 shows an example in which it is applied to the n-type semiconductor device, but it is easy to apply the present invention to the p-type semiconductor device. Further, the present invention can be applied to the CMOS structure which is made up of the combination of the n-type and p-type semiconductor devices in a complementary manner.

Also, as occasions demand, in a substrate on which the n-type semiconductor device and the p-type semiconductor device are mixedly mounted, the structure shown in the embodiment 9 can be applied to only the n-type semiconductor device (or the p-type semiconductor device).

Embodiment 11

The present inventors have confirmed the effects of the insulated gate semiconductor device according to the present invention through simulation. First, the setting parameters for simulation will be described in brief with reference to FIGS. 22A and 22B.

Figure 22A:
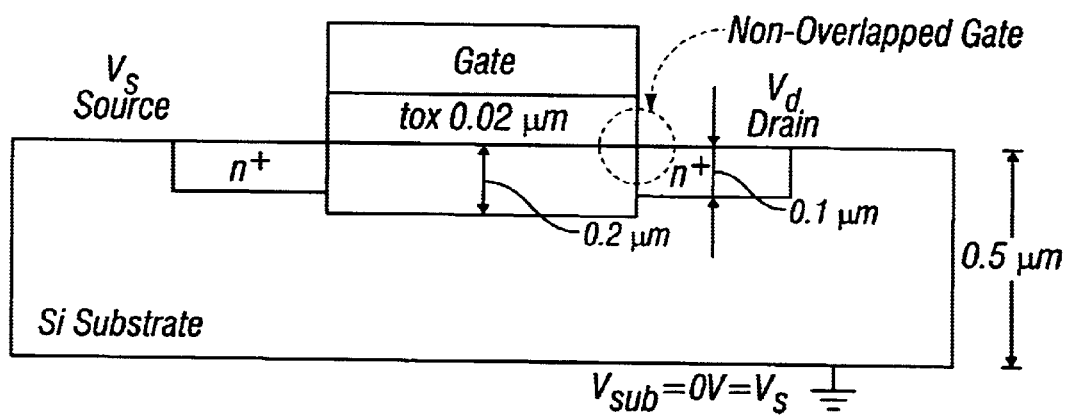
FIGS. 22A, 22B 23 show simulation parameters and a result in accordance with Example 10 of the invention.

FIG. 22A is a cross-sectional view showing a pining FET taken along the channel length. As shown in FIG. 22A, a depth of the junction of the source and the drain wa set to 0.1 $\mu$m, and a depth of the impurity regions for pining (hereinafter referred to as "pining region") was set to 0.2 $\mu$m. Also, a thickness of the silicon substrate was set to 0.5 $\mu$m, and the substrate bias had a ground level which is identical with the source potential of the substrate bias.

Figure 22B:
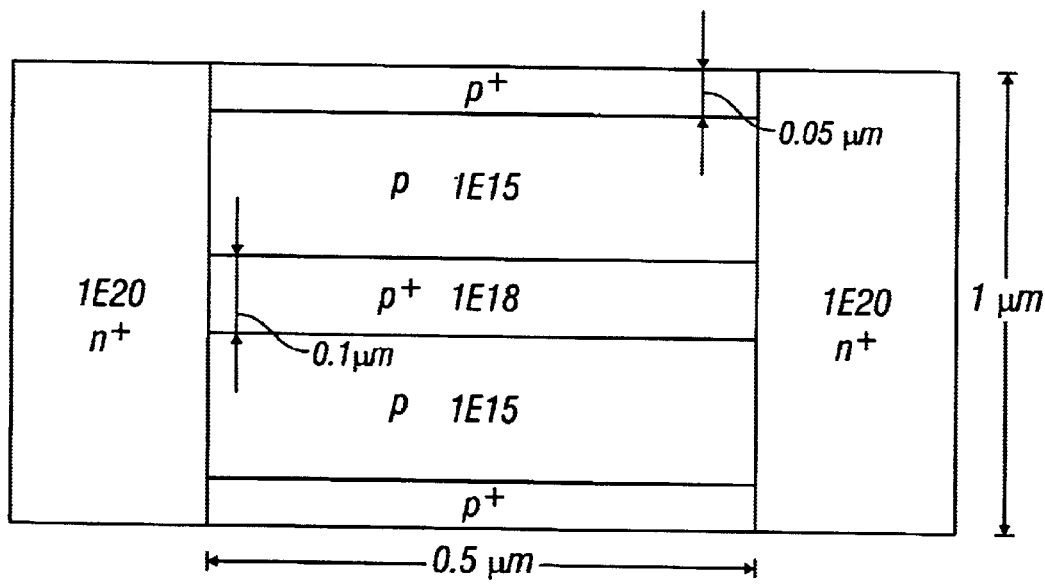

Also, FIG. 22B is a top view showing the pining FET (corresponding to a state of n=1, m=2 in FIG. 1A). As shown in FIG. 21B, the concentration of n-type impurities in the source/drain regions was set to $1 \times 10^{20}$ atoms/cm$^3$, and simply represented by 1E20. The p-type impurity concentration in the pining region (p+) was set to 1E18, and the channel formation region (p) was set to 1E15.

Then, a width of the pining region (corresponding to Wpi.n in FIG. 1A) was set to 0.1 $\mu$m. Calculation was made such that the pining regions formed on both sides of the channel formation region were set to 0.05 $\mu$m of the half. Also, the effective channel width (corresponding to Wpa,m in FIG. 1A) was set to 0.4 $\mu$m. In other words, the total channel width consisting of the width of the pining regions and the effective channel width was adjusted to be 1 $\mu$m. The channel length was set to 0.5 $\mu$m.

Figure 23:
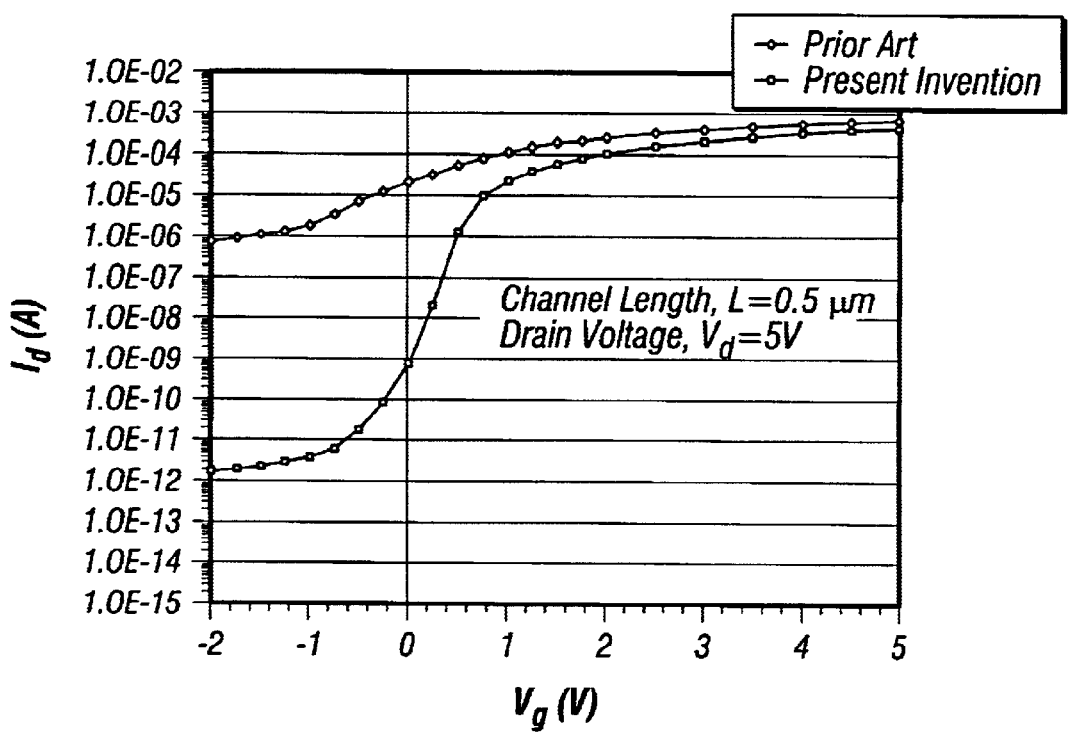
Figure 13A:
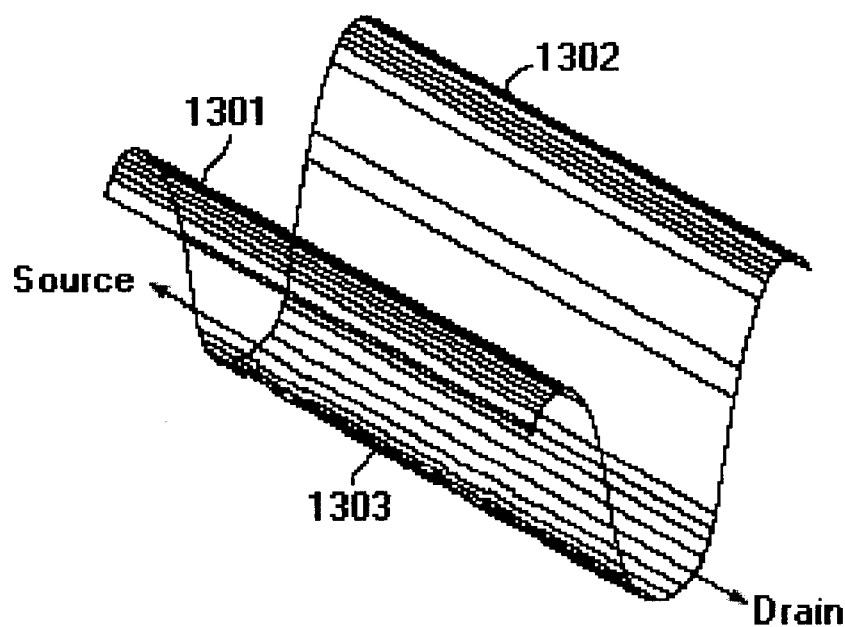
Figure 13B:
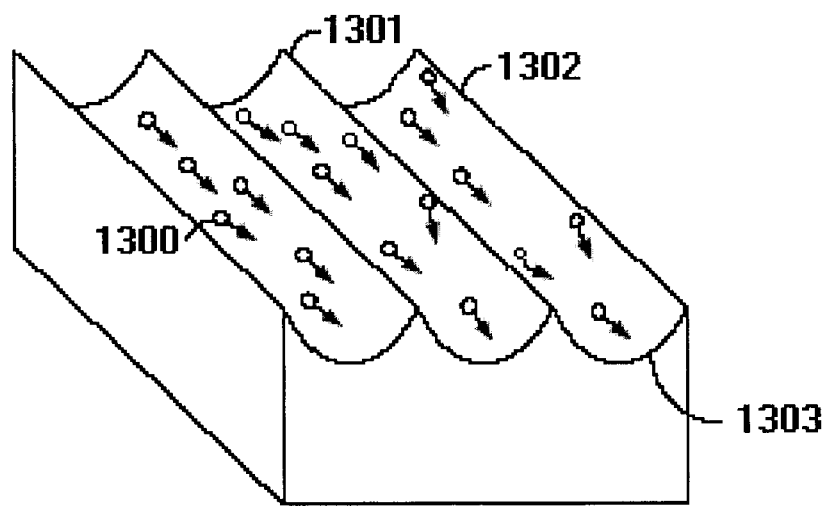

A result of conducting simulation according to the above setting parameters is shown in FIG. 23. FIG. 23 is a graph whose horizontal axis represents a gate voltage and whose vertical axis represents a drain current, which is frequently used in evaluation of the electric characteristics of the transistors. A curve indicated by a white circle represents the electric characteristic in the case of providing no pining region, and a curve indicated by a black circle represents the electric characteristic in the case of providing the pining region.

As is apparent from FIG. 23, in the case of providing no pining region, an off-state current is very high so that it hardly functions as a transistor. However, in the case of providing the pining region, the off-state current is reduced to a level where there arises no problem in practical use, and the sub-threshold characteristic that exhibits the rapidity of on/off switching operation is remarkably improved.

As was described above, it was proved from the simulation that the provision of the pining region with respect to the channel formation region is an every effective means as a countermeasure against the short channel effect.

As was described above, the present invention can prevent the short channel effect caused when the channel length becomes short. In particular, first, the expansion of the drain side depletion layer to the source region or the channel forming region is blocked by the impurity regions which are locally formed in the channel forming region so that the drain voltage is not influenced by the energy (potential) state of the channel forming region. As a result, it is possible to prevent the punch-through phenomenon and the deterioration of the sub-threshold characteristic. Also, a high drain withstand voltage can be realized, simultaneously.

Further, the deterioration of the threshold value voltage which is one feature of the short channel effect can be restrained by an increase of the threshold value voltage which is caused by the narrow channel effect. The narrow channel effect is an effect which is artificially performed by the structure of the present invention that the impurity regions are locally formed in the channel forming region.

As was described above, according to the present invention, even in the semiconductor device in the deep sub-micron region which is short in channel length, operation can be conducted without leading to the short channel effect. Accordingly, using the semiconductor device according to the present invention, an integrated circuit which is integrated with a very high density can be structured.

Also, the slit-like lane region is formed in the channel forming region from the viewpoint of an energy to control the carrier moving direction, thereby being capable of reducing the scattering caused by self-collision between the carriers.

In other words, the impurity scattering, the lattice scattering, and the scattering caused by self-collision between the carriers is remarkably reduced, to thereby improve the mobility. That is, it can be hoped that the semiconductor device represented by the IG-FET is more improved in performance.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulated gate semiconductor device, comprising:
   a semiconductor film comprising a source region, a drain region and a plurality of channel forming regions;
   at least one impurity region in said semiconductor film; and
   a gate electrode formed over said plurality of channel forming regions with a gate insulating film interposed therebetween;

wherein said impurity region includes an impurity element having an opposite conductivity type to that of said source region and said drain regions, wherein said impurity region sections two adjacent channel forming regions of said plurality of channel forming regions, wherein carriers pass only through said plurality of channel forming regions other than said impurity region, wherein a channel length between said said source region and said drain region is within 0.01 to 0.35 $\mu$, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=⅑ to 9 are accomplished between W, Wpi and Wpa.

2. An insulated gate semiconductor device, comprising:

a semiconductor film comprising a source region, a drain region and a plurality of channel forming regions at least one impurity region in said semiconductor film; and a gate electrode formed over said plurality of channel forming regions with a gate insulating film interposed therebetween, wherein said impurity region sections two adjacent channel forming regions of said plurality of channel forming regions, wherein each of said plurality of channel forming regions includes a region in which carriers move while said carriers do not pass through said impurity region, wherein said impurity region has an opposite conductivity type to said source region and said drain regions and a channel length between said source region and said drain regions is within 0.01 to 0.35 $\mu$m, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=⅑ to 9 are accomplished between W, Wpi and Wpa.

3. An insulated gate semiconductor device, comprising:

a semiconductor film comprising a source region, a drain region and a plurality of channel forming regions at least one impurity region in said semiconductor film; and a gate insulating film and a gate electrode formed over said plurality of channel forming regions, wherein said impurity region sections two adjacent channel forming regions of said plurality of channel forming regions, wherein each of said plurality of channel forming regions includes a first region in which carriers move so that the carriers pass only through said first region, wherein said impurity region has an opposite conductivity type to said source region and said drain regions and a channel length between said source region and said drain regions is within 0.01 to 0.35 $\mu$m, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=⅑ to 9 are accomplished between W, Wpi and Wpa.

4. An insulated gate semiconductor device, comprising:

a semiconductor film comprising a source region, a drain region and a plurality of channel forming regions; and a gate insulating film and a gate electrode formed over said plurality of channel forming regions, wherein said semiconductor film includes at least one impurity region having an opposite conductivity type to said source region and said drain regions so that carriers pass only through said plurality of channel forming regions other than said at least one impurity region, wherein said impurity region sections two adjacent channel forming regions of said plurality of channel forming regions, wherein said impurity region and said plurality of channel forming regions extend along a direction connecting said source region and said drain region, wherein a channel length between said source region and said drain regions is within 0.01 to 0.35 $\mu$m, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=⅑ to 9 are accomplished between W, Wpi and Wpa.

5. An insulated gate semiconductor device, comprising:

a source region, a drain region and a plurality of channel forming regions formed in a crystalline semiconductor film on an insulating surface wherein a channel length between said source and drain regions is within 0.01 to 0.35 $\mu$m; and a gate insulating film and a gate electrode formed over said plurality of channel forming regions, wherein said semiconductor film includes at least one impurity region so that carriers pass only through said plurality of channel forming regions other than said at least one impurity region, wherein said impurity region includes an impurity element that gives an opposite conductivity type to said impurity region with respect to a conductivity type of said source region and said drain region wherein said impurity region sections two adjacent channel forming regions of said plurality of channel forming regions, wherein said impurity region and said plurality of channel forming regions extend along a direction connecting said source region and said drain region, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=⅑ to 9 are accomplished between W, Wpi and Wpa.

6. An insulated gate semiconductor device as claimed in any one of claims 1 to 5, wherein at least one section perpendicular to a channel direction of said channel forming regions is substantially regarded as an assembly of a plurality of channel forming regions which are sectioned by said impurity region.

7. An insulated gate semiconductor device as claimed in any one of claims 1 to 5, wherein the lowering of a threshold value voltage which is accompanied by a short channel effect occurring in said channel forming regions when driving is released by an increase in the threshold value voltage which is accompanied by a narrow channel effect obtained by employing said impurity region.

8. An insulated gate semiconductor device as claimed in any one of claims 1 to 5, wherein a plurality of said impurity region are arranged at intervals of 100 to 3000 Å.

9. An insulated gate semiconductor device as claimed in any one of claims 1 to 5, wherein said channel forming regions are intrinsic or substantially intrinsic regions.

10. An insulated gate semiconductor device as claimed in any one of claims 1 to 5, wherein the threshold value voltage is controlled to a predetermined value according to the concentration of the impurity elements which have been added to said impurity region, and the carriers move between the source region and the drain region in a region other than said impurity region.

11. An insulated gate semiconductor device as claimed in any one of claims 1 to 5, wherein said crystalline semiconductor is a monocrystal semiconductor.

12. An insulated gate semiconductor device as claimed in any one of claims 1 to 5, wherein said impurity element is an elements of group XIII or XV.

13. An insulated gate semiconductor device as claimed in claim 12, wherein the elements of group XIII is boron, and the elements of group XV is one of phosphorus and arsenic.

14. An insulated gate semiconductor device as claimed in any one of claims 1 to 5, wherein said impurity region is in a linear pattern which is formed substantially in parallel with a direction of an electric field formed between the source and the drain.

15. An insulated gate semiconductor device as claimed in any one of claims 1 to 5 wherein a concentration of the impurity in said impurity region is not lower than $1 \times 10^{17}$ to $1 \times 10^{20}$ atoms/cm$^3$.

16. An insulated gate semiconductor device according to claim 1 wherein said crystal semiconductor is formed on an insulating surface.

17. An insulated gate semiconductor device comprising:

a semiconductor film comprising a source region, a drain region, and a plurality of channel forming regions wherein said source region and said drain region have an n-type conductivity;

a plurality of impurity regions formed in said semiconductor film wherein said impurity regions are doped with boron at a concentration of $1 \times 10^{17}$ to $1 \times 10^{20}$ atoms/cm$^3$; and a gate insulating film and a gate electrode formed over said plurality of channel forming regions, wherein each of said plurality of impurity regions extend between said source region and said drain region to section two adjacent channel forming regions of said plurality of channel forming regions and a channel length between said source region and said drain regions is within 0.01 to 0.35 μm, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=1/9 to 9 are accomplished between W, Wpi and Wpa.

18. An insulated gate semiconductor device comprising:

a semiconductor film comprising a source region, a drain region, and a plurality of channel forming regions wherein said source region and said drain region have a p-type conductivity;

a plurality of impurity regions formed in said semiconductor film wherein said impurity regions are doped with at least one of phosphorus and arsenic at a concentration of $1 \times 10^{17}$ to $1 \times 10^{20}$ atoms/cm$^3$; and a gate insulating film and a gate electrode formed over said plurality of channel forming regions;

wherein each of said plurality of impurity regions extend between said source region and said drain region to section two adjacent channel forming regions of said plurality of channel forming regions and a channel length between said source region and said drain regions is within 0.01 to 0.35 μm, and wherein W is a width of the channel forming region, Wpi is a width of the impurity region, and Wpa is a width of the portion of the channel forming region other than the impurity region, and relational expressions of Wpi/W=0.1 to 0.9, Wpa/W=0.1 to 0.9 and Wpi/Wpa=1/9 to 9 are accomplished between W, Wpi and Wpa.

* * * * *

UNITED STATES PATENT AND TRADEMARK OFFICE
CERTIFICATE OF CORRECTION

PATENT NO. : 6,653,687 B1
DATED : November 25, 2003
INVENTOR(S) : Shunpei Yamazaki It is certified that error appears in the above-identified patent and that said Letters Patent is hereby corrected as shown below:

Please replace Figs. 13A and 13B (Sheet 10 of 20) with the attached drawing sheet.

Column 17,
Lines 2 and 9, change "1311" to -- 1411 --;
Lines 2 and 10, change "1312" to -- 1412 --;
Lines 10-11, change "1307 and 1308" to -- 1407 and 1408 --; and
Line 11, change "13A" to -- 14A --.

Signed and Sealed this

Sixth Day of April, 2004

JON W. DUDAS
*Acting Director of the United States Patent and Trademark Office*